United States Patent
Ohmori et al.

(10) Patent No.: US 10,627,788 B2
(45) Date of Patent: Apr. 21, 2020

(54) RETRIEVAL APPARATUS AND RETRIEVAL METHOD FOR SEMICONDUCTOR DEVICE PROCESSING

(71) Applicant: HITACHI, LTD., Tokyo (JP)

(72) Inventors: Takeshi Ohmori, Tokyo (JP); Hyakka Nakada, Tokyo (JP); Masayoshi Ishikawa, Tokyo (JP); Masaru Kurihara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 84 days.

(21) Appl. No.: 15/934,362

(22) Filed: Mar. 23, 2018

(65) Prior Publication Data

US 2019/0064751 A1 Feb. 28, 2019

(30) Foreign Application Priority Data

Aug. 24, 2017 (JP) .................................. 2017-161467

(51) Int. Cl.
*G06N 5/04* (2006.01)
*G06F 17/50* (2006.01)
(Continued)

(52) U.S. Cl.
CPC ....... *G05B 13/026* (2013.01); *G05B 13/0265* (2013.01); *G06N 5/046* (2013.01); *H01L 22/20* (2013.01); *H01L 22/12* (2013.01)

(58) Field of Classification Search
CPC .. G05B 13/026; G05B 13/0265; G06N 5/046; H01L 22/20; H01L 22/12
See application file for complete search history.

(56) References Cited

U.S. PATENT DOCUMENTS 7,601,240 B2 10/2009 Kagoshima et al.
9,824,866 B2 11/2017 Kagoshima et al.
(Continued)

FOREIGN PATENT DOCUMENTS

JP 2013-518449 A 5/2013
KR 100463256 B1 1/2005
(Continued)

OTHER PUBLICATIONS

Korean Office Action dated Jun. 17, 2019 for the Korean Patent Application No. 10-2018-0034258.
(Continued)

*Primary Examiner* — Thomas C Lee
*Assistant Examiner* — Thanh Tran
(74) *Attorney, Agent, or Firm* — Volpe and Koenig, P.C.

(57) ABSTRACT

A retrieval apparatus includes a processor and a memory and retrieves a condition given to a semiconductor treatment apparatus. The processor receives a processing result of a semiconductor, a condition corresponding to the processing result, a target value for treating the semiconductor, and a retrieval region. A prediction model is generated indicating a relationship between the condition and the processing result based on a set value of the condition in the retrieval region, and the processing result; calculates a predicted value, performs a demonstration test, acquires an actually measured value, outputs the predicted value as a set value when the actually measured value reaches the target value. When the actually measured value does not reach the target value, the prediction model is updated by applying the predicted value and the actually measured value to the set value and the processing result, respectively.

15 Claims, 19 Drawing Sheets

(51) Int. Cl.
  *G06Q 50/04* (2012.01)
  *H01L 21/02* (2006.01)
  *G05B 13/02* (2006.01)
  *H01L 21/66* (2006.01)

(56) References Cited

U.S. PATENT DOCUMENTS

| | | | |
|---|---|---|---|
| 2002/0128805 A1* | 9/2002 | Goldman | G05B 13/048 |
| | | | 703/2 |
| 2004/0225377 A1* | 11/2004 | Kokotov | G05B 11/32 |
| | | | 700/1 |
| 2005/0267607 A1* | 12/2005 | Paik | G05B 19/41875 |
| | | | 700/31 |
| 2006/0212156 A1* | 9/2006 | Tanaka | G05B 13/048 |
| | | | 700/121 |
| 2010/0138026 A1 | 6/2010 | Kaushal et al. | |
| 2014/0037187 A1 | 2/2014 | Marcuccilli et al. | |
| 2017/0109646 A1 | 4/2017 | David | |
| 2017/0242955 A1* | 8/2017 | Ono | G06F 17/5072 |

FOREIGN PATENT DOCUMENTS

| | | |
|---|---|---|
| KR | 10-2013-0054099 A | 5/2013 |
| TW | 201305836 A | 2/2013 |
| TW | 201415008 A | 4/2014 |

OTHER PUBLICATIONS

Taiwanese Office Action dated Sep. 23, 2019 for the Taiwanese Patent Application No. 107110006.

\* cited by examiner

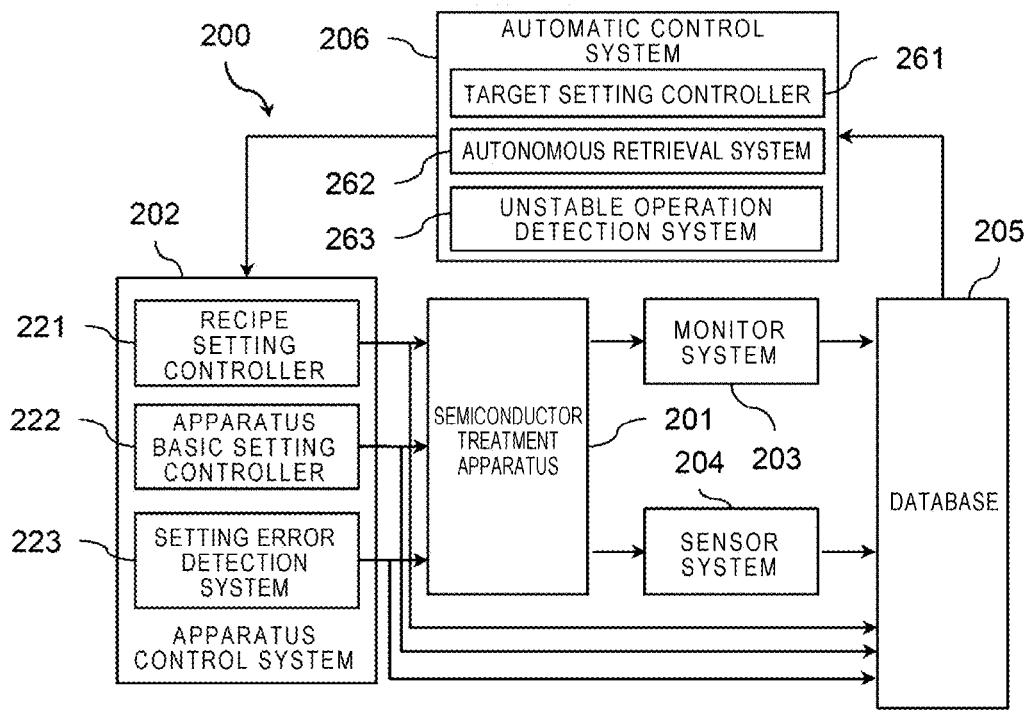
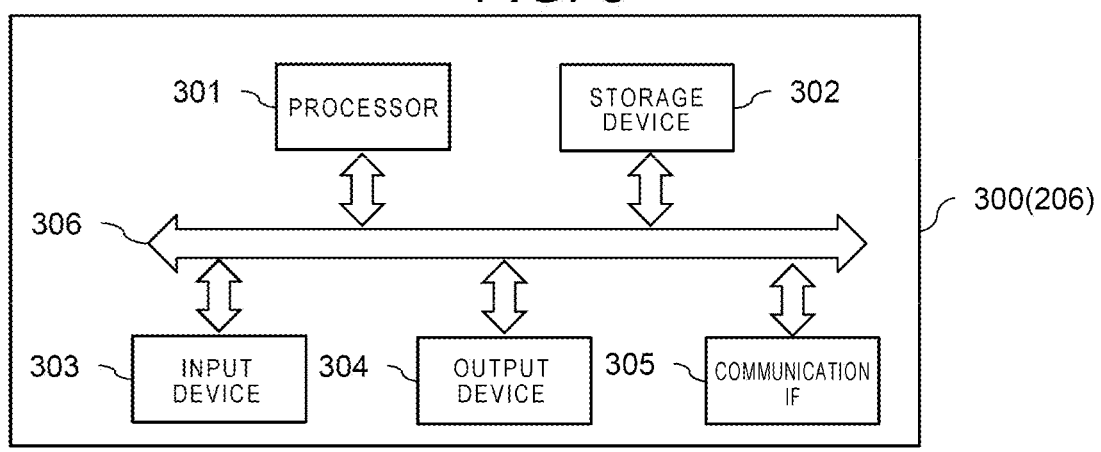

US 10,627,788 B2

RETRIEVAL APPARATUS AND RETRIEVAL METHOD FOR SEMICONDUCTOR DEVICE PROCESSING

CLAIM OF PRIORITY

The present application claims priority from Japanese patent application JP 2017-161467 filed on Aug. 24, 2017, the content of which is hereby incorporated by reference into this application.

BACKGROUND OF THE INVENTION

Field of the Invention

The present invention relates to a retrieval apparatus and a retrieval method for retrieving a solution.

Background Art

In order to improve performance of a semiconductor device, a new material forming the semiconductor device is introduced, and a structure of the semiconductor device is also complicated. The accuracy in a nanometer level is required in processing of a semiconductor device. In order to improve productivity of a semiconductor device, a mass-production process is required to be continuously performed as long as possible in a state of maintaining the accuracy. In order for a semiconductor device to satisfy the requirements, various kinds of materials and structures are required to be processed with considerably high accuracy. Therefore, a control range of a semiconductor treatment apparatus treating a semiconductor device is widened, and thus a plurality of control parameters are added. High productivity is maintained, and a high performance semiconductor device is also produced, by using the semiconductor treatment apparatus.

On the other hand, it is necessary to determine several kinds to several tens of kinds of input parameters for each semiconductor treatment apparatus in order, to sufficiently extract performance of the semiconductor treatment apparatus. A single process includes a plurality of steps, and an input parameter is required to be changed in each step. Therefore, it is considerably difficult to find a combination of input parameters causing a target, processing result to be obtained. Thus, it takes a long time to develop a processing condition, and thus development cost increases. The number of processes with high difficulty is increased, and the number of top engineers having advanced knowledge and techniques coping therewith is insufficient.

It is necessary to acquire data regarding a state of a semiconductor treatment apparatus which mass produces semiconductor devices and data regarding processing results in order to maintain and improve productivity. A plurality of sensors and a monitor are mounted in a semiconductor treatment apparatus in order to acquire such data. In order to perform control for correcting changes in the data regarding a state of a semiconductor treatment apparatus which mass produces semiconductor devices and the data regarding processing results, it is necessary to analyze a relationship among sensor data, monitor data, and the processing results, so as to find a control parameter. Since processing control in a nanometer level is performed, the number of sensors and monitors for manufacturing situations mounted in a semiconductor treatment apparatus is increased, and the frequency of acquiring data is also increased. Consequently, an amount of acquired data is increased. Therefore, development of a necessary control method for a highly accurate semiconductor treatment apparatus is considerably hard since analysis of a large amount of data and verification of control performance are necessary.

Manufacturing of an advanced device such as a semiconductor device requires development of an advanced method for a semiconductor treatment apparatus in order to secure productivity. The aging method for a semiconductor treatment apparatus is a method for suppressing; a performance difference between semiconductor treatment, apparatuses, correcting temporal changes in processing characteristics during mass production, and reducing a performance difference between semiconductor treatment apparatuses which cannot be corrected through maintenance of the semiconductor treatment apparatuses. Development of the aging method for a semiconductor treatment apparatus is provided by a top engineer having advanced knowledge and techniques. However, the number of wafers to be treated and the number of processes with high difficulty in manufacturing of semiconductor devices are increased, and thus the lack of the number of top engineers is getting worse. Thus, the number of processes which do not reach analysis is, increased by acquiring only data.

From the above description, a semiconductor treatment apparatus is required to have a function of automatically extracting performance of the semiconductor treatment apparatus for itself and a function of supporting an engineer, extracting the performance of the semiconductor treatment apparatus.

JP-T-2013-518449 discloses a technique in which data of when a recipe of a manufacturing tool is incrementally or randomly changed is learned by using an autonomous learning system based, on biology, and a recipe adjusted by using the result is generated.

SUMMARY OF THE INVENTION

For example, input parameters of a semiconductor treatment apparatus are parameters for determining an operation of the semiconductor treatment apparatus, and are input parameters such as a gas species, a gas flow rate, pressure, supplied power, a voltage, a current, a treatment time, a heating temperature, a cooling temperature, a dose, and a light amount. Output parameters of a semiconductor treatment apparatus are parameters obtained by monitoring or measuring a treatment object (treatment result) during treatment or after treatment in the semiconductor treatment apparatus, and are output parameters such as a critical dimension (CD), a thickness of a deposited film, etch rate (ER), a processed shape, and a mask selectivity, and output parameters indicating processing results such as wafer in-surface distribution and uniformity. As sensor data and monitor data related to the processing results, there are pieces of data such as a light reflection spectrum, a plasma light spectrum, a wafer incidence current, a wafer voltage, a wafer temperature, and an apparatus component temperature, and data indicating a spatial distribution thereof and uniformity. The sensor data and the monitor data are also output parameters.

It is necessary to analyze input and output data from one input and one output to multiple inputs, and multiple outputs in order to analyze, an input-output relationship in a semiconductor treatment apparatus. In order to obtain a combination of input parameters satisfying a target output result, it is necessary to search a wide apparatus parameter space formed of input parameters and output parameters.

For example, a case is assumed in which, as retrieved input parameters, fundamental five kinds of input parameters such as respective flow rates of two usage gas species, gas pressure, discharge power, and wafer application bias power are selected. A control range of each input parameter is as follows. A control range of both of the gas flow rates is 100 to 200 seem, a control range of the gas pressure is 1 to 10 Pa, a control range of the discharge power is 500 to 1500 W, and a control range of the bias power is 0 to 100 W, and these ranges are typical ranges. Typical values of the minimum widths of which the respective parameters are changed are as follows. The value of both of the gas flow rates is 1 sccm, the value of the gas pressure is 0.1 Pa, the value of the discharge power is 1 W, and the value of the bias power is 1 W.

In this case, rough computation of all combinations of the control ranges of the input parameters in the entire apparatus parameter space, that is, the number of retrieval conditions is $100 \times 100 \times 100 \times 1000 \times 100 = 10^{11}$. In a case where the time required for one retrieval is about one minute, one hundred thousand or more year is required for retrieval of all of the retrieval conditions, and this is not possible.

If the number of values of each input parameter in one retrieval set is set to ten, the number of combinations of the input parameters in retrieval is $10^5$. In a case where the time required for one retrieval is about one minute, time of two months or more is required for retrieval of one set. In order to reach a target solution by repeatedly performing retrievals and analysis of retrieval results, it is necessary to reduce the time required for one retrieval set to several days or less at longest, preferably one hour or less. Therefore, in order to reach a target solution, it is considerably important to set input parameters in retrieval, that is, to determine a retrieval region.

In a case where the number of retrieval conditions in one retrieval set is set to 100 conditions, a retrieval time is set to one hour, and 2000 conditions are retrieved a day by repeatedly performing retrieves, 0.000002% of the region is searched a day among the number of conditions "$10^{11}$" of the apparatus parameter space. In a case where this is continuously performed for one month, that is, 60,000 retrieval sets are executed, a region of 0.00006% of the apparatus parameter space is searched. Therefore, in a case where a retrieval region in one retrieval set is wide, if the retrieval region is changed at random, a probability of reaching an optimal solution is extremely low. In a case where there are overlapping retrieval regions, the time required to reach an optimal solution is further increased.

The input-output relationship in a semiconductor treatment apparatus is nonlinear in the most cases, and there are many local solutions in the apparatus parameter space. Thus, a value of an input parameter satisfying a value of an output parameter is scarcely found through data analysis and estimation performed once. Assuming a case where about one local solution is present in a retrieval region of 1% of the apparatus parameter space, if a retrieval region is set to be narrow, and the retrieval region is selected at random, a local solution is reached with probability of 99% even if the best solution in or near the retrieval region can be reached. Therefore, it is necessary to determine a retrieval region so as to avoid a local solution with high efficiency or to increase a probability of reaching a solution after reaching a local solution.

However, in the technique disclosed in JP-T-2013-518449, a recipe is merely incrementally or randomly changed during data learning, and thus there is a problem in that a probability of reaching the best solution which is an input parameter serving as a solution is considerably low. In other words, there is a problem in that a probability of reaching a local solution which is an inferior result compared with the best solution is considerably high.

An object of the present invention is to achieve an efficient operation of a semiconductor treatment apparatus.

According to one aspect of the present invention disclosed in the present specification, there is provided a retrieval apparatus which retrieves a condition given to a semiconductor treatment apparatus, the retrieval apparatus including a processor; and a memory, in which the processor receives a processing result of a semiconductor being treated by the semiconductor treatment apparatus, a condition corresponding to the processing result, a target value for treating the semiconductor in the semiconductor treatment apparatus, and a retrieval region defined by ranges of the condition and the processing result, generates a prediction model indicating a relationship between the condition and the processing result on the basis of a set value of the condition in the retrieval region, and the processing result in a case where the set value is given to the semiconductor treatment apparatus, calculates a predicted value from the prediction model by giving the received target value to the prediction model, transmits the predicted value to the semiconductor treatment apparatus to perform a demonstration test, and acquires a result of the demonstration test as an actually measured value, and determines whether or not the actually measured value reaches the target value, outputs the predicted value as a set value of the condition in a case where the actually measured value reaches the target value, and applies the predicted value and the actually measured value to the set value of the condition and the processing result, respectively, so as to update the prediction model in a case where the actually measured value does not reach the target value.

According to the representative embodiment of the present invention, it is possible to achieve an efficient operation and optimization of a process in a semiconductor treatment apparatus. Objects, configurations, and, effects other than those described above will become apparent through description of the following embodiment.

BRIEF DESCRIPTION OF THE DRAWINGS

FIG. 2 illustrates Example 1 of the present invention, and is an explanatory diagram illustrating a system configuration example of a semiconductor manufacturing system.

FIG. 3 illustrates Example 1 of the present invention, and is a block diagram illustrating a hardware configuration example of a retrieval apparatus.

DETAILED DESCRIPTION OF THE INVENTION

Hereinafter, an embodiment of the present invention will be described with reference to the accompanying drawings.

Example 1

Input Parameter Retrieval Examples

Figure 1:
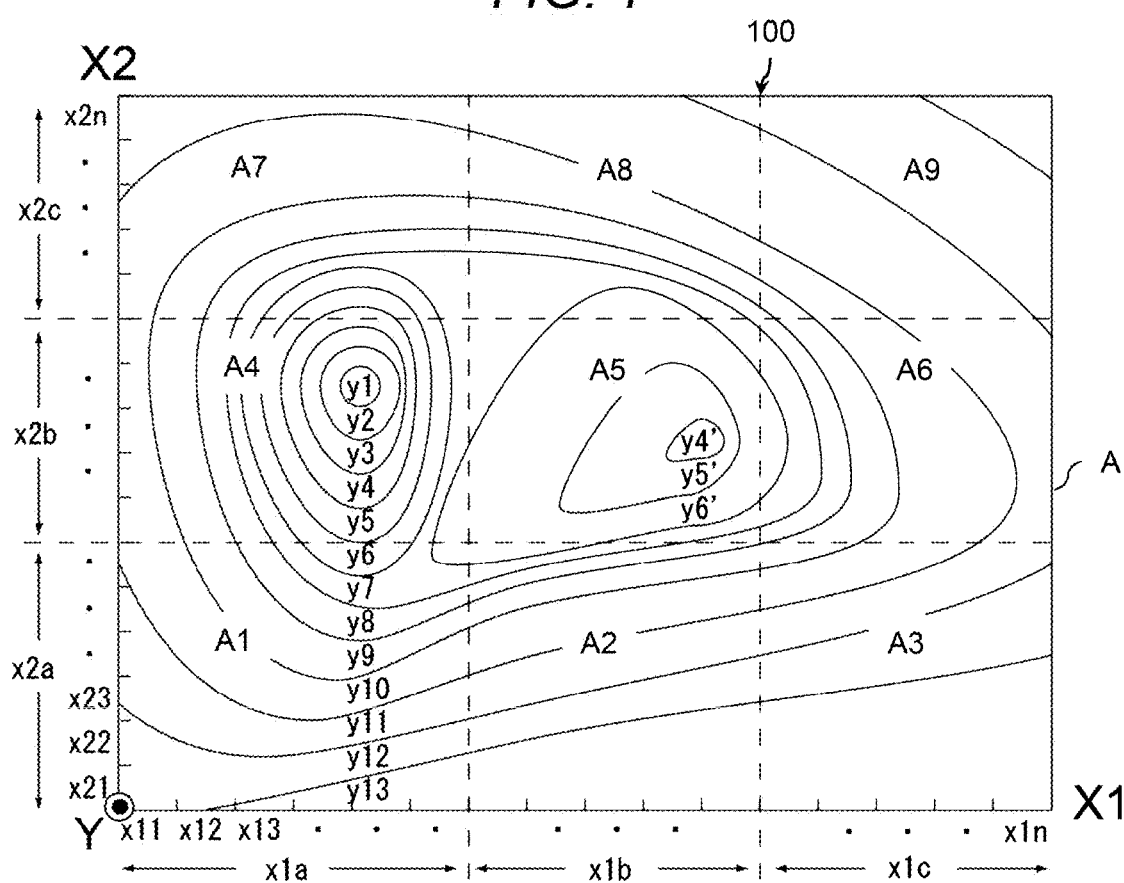
FIG. 1 illustrates Example 1 of the present invention, and is an explanatory diagram illustrating input parameter retrieval examples.

FIG. 1 is an explanatory diagram illustrating input parameter retrieval examples. FIG. 1 illustrates examples of combinations of input and output data, that is, input data and output data for a semiconductor treatment apparatus when input data (the above-described value of an input parameter) causing output data (the above-described value of an output parameter) satisfying a target to be obtained is retrieved in the semiconductor treatment apparatus.

Here, the semiconductor treatment apparatus is an apparatus treating a semiconductor or a semiconductor device including a semiconductor. Specifically, the semiconductor treatment apparatus includes, for example, a lithography apparatus, a film forming apparatus, a pattern processing apparatus, an ion implanting apparatus, a heating apparatus, and a cleaning apparatus. The lithography apparatus includes an exposure apparatus, an electron beam drawing apparatus, and an X-ray drawing apparatus. The film forming apparatus includes, for example, a deposition apparatus such as a chemical vapor deposition (CVD) apparatus or a physical vapor deposition (PVD) apparatus, a sputtering apparatus, and a thermal oxidation apparatus. The pattern processing apparatus includes, for example, a wet etching apparatus, a dry etching apparatus, an electron beam processing apparatus, and a laser processing apparatus. The ion implanting apparatus includes a plasma doping apparatus, and an ion beam doping apparatus. The heating apparatus includes, for example, a resistance heating apparatus, a lamp heating apparatus, and a laser beating apparatus. The cleaning apparatus includes, a liquid cleaning apparatus and an ultrasonic cleaning apparatus.

FIG. 1 illustrates a graph 100 having a two-dimensional coordinate plane in two axes such as an X1 axis and an X2 axis. An axis orthogonal to the coordinate plane is set to a Y axis. The X1 axis is, a coordinate axis of an input parameter X1 which is input to the semiconductor treatment apparatus, and the X2 axis is a coordinate axis of an input parameter X2 which is input to the semiconductor treatment apparatus. Input data $x1n$ (where n is 1, 2, 3, . . . ) which is a value of the input parameter X1 is plotted on the X1 axis, and input data $x2n$ which is a value of the input parameter X2 is plotted on the X2 axis. In the graph 100, output data of the Y axis in each region determined by the input data $x1n$ and $x2n$ is expressed by contour lines. As an example, a region including output data y1 is set to the maximum value (that is, the best solution), and a region including output data y13 is set to the minimum value, in the graph 100, the X1 axis is divided into three regions such as $x1a$, $x1b$, and $x1c$. Similarly, in the graph 100, the X2 axis is divided into three regions such as $x2a$, $x2b$, and $x2c$.

For example, in a case where a combination of the input data $x1n$ and $x2n$ causing a region in which output, data is highest, that is, the output data y1 to be obtained is retrieved as a target, regarding an analysis method, an inclination of output data yn in an apparatus parameter space may be acquired, and a retrieval may be performed such that the output data yn increases.

However, in a case where output data at that time does not include output data of a region determined by $x1a$ and $x2b$, a retrieval is directed toward output data y4' at a vertex, serving as a local solution. If an input parameter to be retrieved according to this result, output data near y4' is acquired in a concentration manner, and thus an input parameter causing y4' or output data very close thereto to be obtained is found. In other words, even if analysis using a value of the input parameter acquired through the retrieval and acquisition of a value of an output parameter through a further retrieval are repeatedly perform, input data of the best solution corresponding to the output data y1 cannot be found.

In a case where a plurality of local solutions are present near the output data y1 or other regions, if the number of values of acquired input parameters is small relative to the width of the apparatus parameter space, a retrieval falls into a local solution, and thus there is a high probability that the output data y1 may not be found. As a region in which an estimated solution is presented, a region determined by x13 and x23 is assumed to be estimated. If a retrieval region is restricted to a minute region such as a part of the region of x13 and x23 as in JP-T-2013-518449, since an inclination of the output, data yn is considerably small, the number of retrievals becomes large until finally reaching the output data y1, and thus there is a probability that the retrievals may fail. The inclination of the output data yn is buried in noise contained in the output data yn, and thus there is a probability that the retrievals may fail. If the quality of the output data yn which is an analysis object is low, estimation of a solution essentially leads to a bad result, and thus it is necessary to designate a retrieval space for acquiring high quality data which can approach a solution.

In FIG. 1, three parameters such as $x1n$, $x2n$, and yn are used. In an actual semiconductor treatment apparatus, a plurality of input and output parameters are used, and thus a wide apparatus parameter space in which the indexes on the respective axes in FIG. 1 are vectorized in multiple dimensions is searched. Therefore, it is necessary to designate an apparatus parameter space in order to acquire high quality data which can approach a solution with high efficiency from the wide, apparatus parameter space. The input-output relationship in a semiconductor treatment apparatus is nonlinear in the most cases, and there are many local solutions in the apparatus parameter space.

In the present example, a test condition for searching the apparatus parameter space is automatically determined by taking into consideration an analysis result of input and output data for the semiconductor treatment apparatus, and, verification of a test result (processing result) is automatically performed, and these automatic operations are repeatedly performed. Consequently, the best solution is efficiently acquired by searching the apparatus parameter space. In other words, a value of an input parameter causing a target state of the semiconductor treatment apparatus and a value of an output parameter indicating a processing result to be obtained is found efficiently.

System Configuration Example

FIG. 2 is an explanatory diagram illustrating a system configuration example of the semiconductor manufacturing system. A semiconductor manufacturing system 200 is provided with a semiconductor treatment apparatus 201, an apparatus control system 202, a monitor system 203, a sensor system 204, a database 205, and an automatic control system (retrieval apparatus) 206.

The semiconductor treatment apparatus 201 is an apparatus treating a substrate such as a wafer or a semiconductor device as described above. The semiconductor treatment apparatus 201 is connected to the apparatus control system 202, the monitor system 203, and the sensor system 204.

The apparatus control system 202 is a system controlling the semiconductor treatment apparatus 201 in a case where the semiconductor treatment apparatus 201 performs an operation and treatment. The apparatus control system 202 includes an input interface such as a GUI, and controls an operation of the semiconductor treatment apparatus 201 with a value of an input parameter which is input via the input interface. The apparatus control system 202 includes a network interface, and acquires a value of an input parameter from an external computer and the database 205 via the network interface.

The apparatus control system 202 includes a recipe setting controller 221, an apparatus basic setting controller 222, and a setting error detection system 223. The recipe setting controller 221 sets an input parameter for determining an operation of the semiconductor treatment apparatus 201 during treatment and a value thereof in the semiconductor treatment apparatus 201. The apparatus basic setting controller 222 sets an input parameter for starting the semiconductor treatment apparatus 201 and a value thereof in the semiconductor treatment apparatus 201.

The setting error detection system 223 determines whether or not an input parameter can be actually set in the semiconductor treatment apparatus 201 when the apparatus basic setting controller 222 sets the input parameter. Specifically, for example, the setting error detection system 223 determines whether or not an input parameter which is input is within a range in which the input parameter can be input, and whether or not a combination of values of input parameters causes the semiconductor treatment apparatus 201 to be operated. In a case where a value of an input parameter which cannot be set or a combination thereof is detected, the setting error detection system 223 reports the detection result to an engineer or a host system connected to the semiconductor treatment apparatus 201 as a setting error. In a case where a setting error occurs, stopping of changing of an input parameter which is input or stopping of treatment using a value of an input parameter which is input is recorded as log data.

The monitor system 203 is a system which, monitors or measures a treatment object (processing result) during treatment or treated in the semiconductor treatment apparatus 201 so as to acquire monitor data. The monitor system 203 includes an optical monitor, a processing dimension measurement apparatus using an electron microscope, a temperature measurement apparatus using infrared light, a defect detection apparatus using a Kelvin probe force microscope, and a prober apparatus evaluating electrical characteristics of a treatment object. The monitor system 203 measures, for example, reflection, transmission, absorption, and polarization spectra of when light, laser light, and X-rays are made to be incident to a treatment object, so as to acquire a processed shape of the, treatment object, and a thickness and a processing detect of a treatment object film as monitor data. The monitor system 203 is not required to be directly connected to the semiconductor treatment apparatus 201, and, a measurement result may be acquired by carrying a treatment object to the monitor system 203, and the result may be stored in the database 205. A part of the treatment object may be taken out as a fragment, a measurement result may be acquired by carrying the fragment to the monitor system, and the result may be stored in the database 205.

The monitor system 203 monitors a medium used for treatment, such as plasma, a gas, or a liquid action on a treatment object during the treatment, and a product generated through the treatment. The medium and the product directly act on a treatment object or is generated as a result of the action. The monitor system 203 includes a plasma emission monitor using light spectrum measurement, a deposit monitor in a treatment chamber using infrared spectrum measurement, a monitor monitoring atoms and molecules emitted from a treatment object by using a mass spectrometer, and an electrical characteristic monitor in a treatment chamber using a probe. In this monitoring using the monitor, monitor data for indirectly evaluating a treatment result can be measured, in real time, and immediately during treatment.

The sensor system 204 is a system acquiring sensor data indicating an apparatus state of the semiconductor treatment apparatus 201. The sensor system 204 is an aggregate of sensors. The sensor data includes power source output, values such as a voltage, a current, and power, values of variable electric elements such as capacitors or coils in a matching device, flow rates of various usage gases, temperatures of apparatus bodies or apparatus constituent elements, pressure inside a treatment chamber, an opening of a pressure control valve, a valve opening/closing state, a gas exhaust speed, and an operation timing and an operation time point of treatment and an apparatus.

The database 205 stores values of various input parameters set by the apparatus control system 202, values of output parameters which are treatment results from the semiconductor treatment apparatus 201, and, monitor data and sensor data acquired by the monitor system 203 and the sensor system 204. The database 205 stores learning data. The learning data is input and output data which is a set of a value of an input parameter (input data) which was input to the semiconductor treatment apparatus 201 in the past and a value of an output parameter (output data) output from the semiconductor treatment apparatus 201. The database 205 may be a distributed database 205 which stores various stored data in another storage device 302. Distributed databases may be built in a form of storing information handled by respective systems in the systems.

The automatic control system 206 retrieves a solution satisfying a target by using the data stored in the database 205. The solution satisfying the target is a value of at least one parameter of a value of an input parameter used to operate the semiconductor treatment apparatus 201 and a value of an input parameter used to operate the semiconductor treatment apparatus 201 during treatment. The automatic control system 206 is provided with a target setting controller 261, an autonomous retrieval system 262, and an unstable operation detection system 263.

The target setting controller 261 receives input of a target value of an input parameter, a target value of an output parameter, and an allowable value of a difference or deviation between a retrieval, result and a target. The target setting controller 261 may receive input of an upper limit of time taken to execute one condition in a retrieval, the number of retrievals, an upper limit of a total time for one retrieval set, an upper limit of a total time for all of the retrievals, an upper limit of an analysis time for a retrieval result, and an upper limit of the number of pieces of analysis data. The target setting controller 261 may set whether or not each input parameter is to be retrieved, an upper limit value and a lower limit value of a control range of a retrieved input parameter, and a value for restricting a control range of a retrieved input parameter. The target setting controller 261 may receive input of the best solution before a retrieval including a past result, analysis object data used to obtain the solution, and a model function for explaining a relationship between a target and an input parameter, obtained through the analysis.

The autonomous retrieval, system 262 acquires the content which is input to the target setting controller 261, and sets division regions obtained by dividing a control range of an input parameter which can be retrieved into two or more regions with respect to one or n ore parameters. As described above, in order to reach a target solution by repeatedly performing retrievals and analysis of retrieval results, it is necessary to reduce the time required for one retrieval set to several days or less at longest, preferably one hour or less. In other words, if the number of retrieval conditions for one retrieval set is indicated by Ns, a retrieval time for one retrieval set is indicated by Ts [min], and the time required for one retrieval condition is indicated by t1 [min], the number of retrievals is expressed by Equation (1.1).

$$Ts = t1 \cdot Ns \qquad (1.1)$$

The number Ns of retrieval conditions may be determined such that Ts≤1440 is satisfied in a case where the time required for one retrieval set is set to one day or less, and such that Ts≤60 is satisfied in a case where the time required for one retrieval set is set to one hour or less.

In order to increase the number Ns of retrieval conditions, it is effective to reduce measurement time in the sensor and the monitor for evaluating a retrieval result. Particularly, it is effective to use a sensor and a monitor which can perform measurement in real time in a retrieval test.

As described above, characteristics of a medium acting on a treatment object and a product generated through treatment, which are data for indirectly evaluating a treatment result, are measured by the sensor and the monitor, and can thus be measured in real time and immediately during treatment.

As the number of input parameters to be changed in retrieves are increased, the retrieval time Ts rapidly increases. For example, in a case where the number Da of input parameters is set to Da=10, and the region division number A of each parameter is set to A=3, the number Ns of retrieval conditions in a case where all combinations of parameters are retrieved is expressed by Equation (1.2).

$$Ns = A^{Da} \qquad (1.2)$$

The number Ns of retrieval conditions increases to 59049. In this case, preferably, a value of each input parameter in which a solution is predicted to be present is predicted, and the number of input parameters which can be simultaneously changed during a retrieval is restricted with the predicted value as a central condition. Consequently, the number Ns of retrieval conditions and the retrieval time Ts are executable values. A past retrieval result or knowledge of an engineer may be used to predict the central condition. Alternatively, a retrieval may be started by using an appropriate central condition as an initial value in the retrieval.

Among pieces of data included in, acquired learning data, a condition in which a difference between data and a target is the minimum (closest to the target) may be used as a central condition. A sum total of errors of respective parameters may be used as a value indicating a difference between learning data and a target. The errors may be computed by using differences, absolute values, or square errors among or, of respective parameters.

For example, in a case where a division region in which a solution is estimated to be present is designated with respect to five of ten input parameters, the number Ns of retrieval conditions of the next time can be reduced to Ns=$3^5$=243 by changing the other five input parameters. Among the ten input parameters, the number of input parameters which can be changed at a time is, indicated by Dc. The number Ns of retrieval conditions is obtained according to Equation (1.3) by using the symbol C in the combinatorics.

$$Ns = 1 + \sum_{i=1}^{Dc} (A-1)^i_{Da} C_i \qquad (1.3)$$

The number Ns of retrieval conditions can be reduced by restricting input parameters which can be changed at a time. For example, if the number Dc of changeable input parameters is set to Dc=1, the number Ns of retrieval conditions can be reduced to Ns=21, and, similarly, if the number Dc of changeable input parameters is set to Dc=2, the number Ns of retrieval conditions can be reduced to Ns=201. There may be a combination of a method of designating a division region in which a solution is estimated to be present in some input parameters among input parameters and a method of designating parameters which can be changed at a time.

The unstable operation detection system 263 detects a case where the semiconductor treatment apparatus 201 can continuously perform a treatment operation but performs unstable treatment during execution of a retrieval. The setting error detection system 221 checks whether Or not an input parameter can be input in a previous stage of inputting the input parameter. However, media and components which are controlled by equipment in the semiconductor treatment apparatus 201 have nonlinear property, and treatment is performed by combining the media and the, components with each other. Therefore, there is a probability that the setting error detection system 223 may not detect a setting error (that an input parameter cannot be input), and an input parameter causing an unstable operation may be found for the first time when treatment is actually performed.

Since the apparatus parameter space is enlarged as the number of input parameters increases, in a case where a local unstable operation region is present in the apparatus parameter space, there is a high probability that the region may not be detected in advance.

Therefore, in a case where the unstable operation detection system 263 detects an unstable operation of the semiconductor treatment apparatus 201 during treatment in the semiconductor treatment apparatus 201, the semiconductor treatment apparatus 201 stores an input parameter and a value thereof of when the unstable operation occurs, and reports the fact to an engineer or a host system corresponding to the semiconductor treatment apparatus 201. Consequently, it is possible to determine or predict an operation defect in treatment and, a retrieval due to an unstable operation of the semiconductor treatment apparatus 201.

In a case where an unstable operation is detected, a retrieval is continued by executing a sequence for recovering the semiconductor treatment apparatus 201 to a normal operation state after treatment completion, or by immediately stopping treatment and executing a sequence for recovering the semiconductor treatment apparatus 201 to a normal operation state.

Such an unstable operation includes local abnormal discharge or a swing of discharge intensity during treatment, a rapid film formation rate change or film quality change, a swing of gas pressure, and an instantaneous change or a swing of supplied power. A monitor which can perform measurement in real time or immediately during treatment, such as the above-described emission spectrum monitor, deposit monitor, mass spectrometric monitor, electrical characteristic monitor, and pressure monitor, detects an unstable operation.

Hardware Configuration Example of Retrieval Apparatus

FIG. 3 is a block diagram illustrating a hardware configuration example of a retrieval apparatus 300. The retrieval apparatus 300 retrieves a value of an input parameter which is a solution from a retrieval region. The automatic control system 206 is an example of the retrieval apparatus 300. The retrieval apparatus 300 is provided with a processor 301, a storage device 302, an input device 303, an output device 304, and a communication interface (communication IF 305). The processor 301, the storage device 302, the input device 303, the output device 304, and the communication IF 305 are connected to each other via a bus. The processor 301 controls the retrieval apparatus 300. The storage device 302 is a work area of the processor 301. The storage device 302 is a non-transitory or transitory recording medium storing various programs or data. As the storage device 302, there are, for example, a read only memory (ROM), a random access memory (RAM), a hard disk drive (HDD), and a flash memory. The input device 303 inputs data. As the input device 303, there are, for example, a keyboard, a mouse, a touch panel, ten keys, and a scanner. The output device 304 outputs data. As the output device 304, there are, far example, a display and a printer. The communication IF 305 is connected to a network, and transmits and receives data.

Functional Configuration Example of Retrieval Apparatus 300

Figure 4:
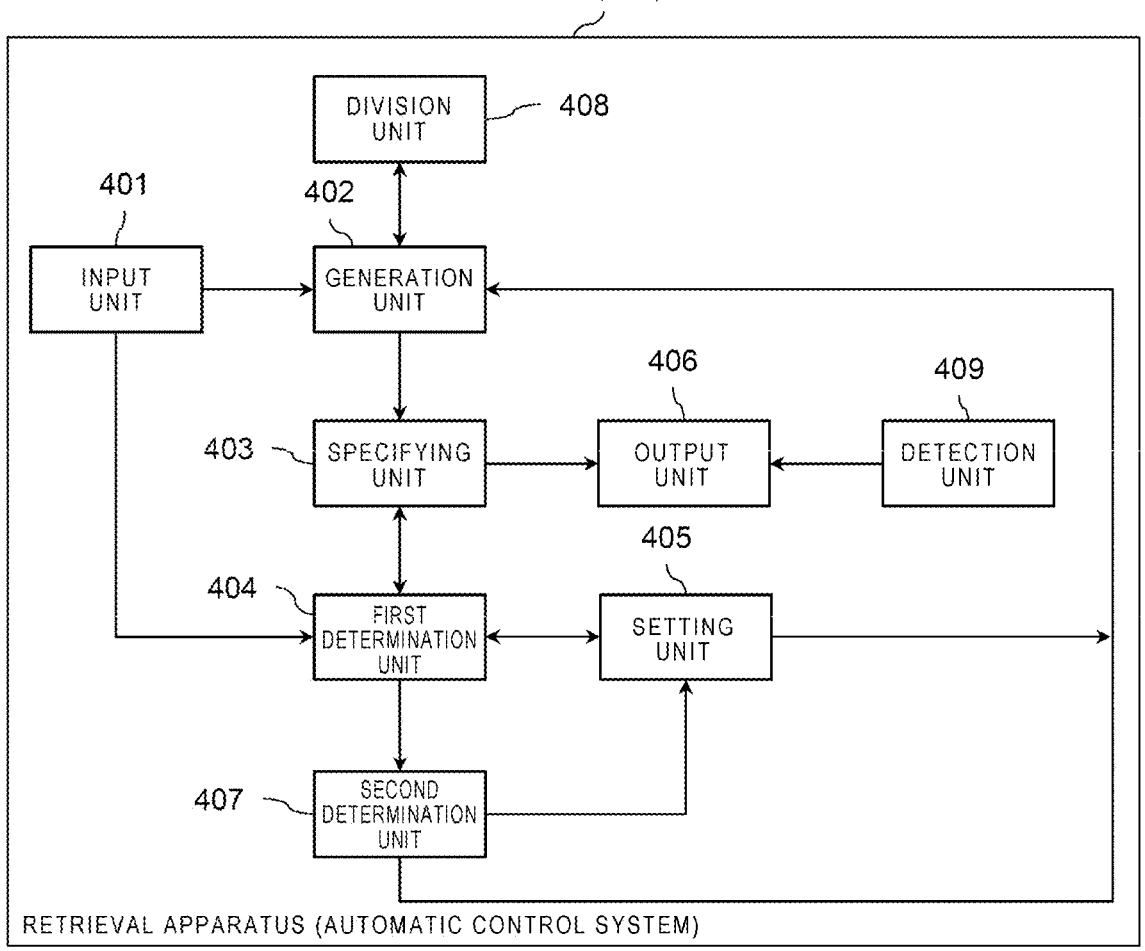
FIG. 4 illustrates Example 1 of the present invention, and is a block diagram illustrating a functional configuration example of the retrieval apparatus.

FIG. 4 is a block diagram illustrating a functional configuration example of the retrieval apparatus 300. The retrieval apparatus 300 is provided with an input unit 401, a generation unit 402, a specifying unit 403, a first determination unit 404, a setting unit 405, an output unit 406, a second determination unit 407, a division unit 408, and a detection unit 409. Specifically, each of the constituent elements 401 to 409 is a function, for example, by the processor 301 executing a program stored in the storage device 302 illustrated in FIG. 3.

The input unit 401 receives input of video data through a user's operation or by reading data from the database 205. Specifically, for example, the input unit 401 receives input of condition values set in the semiconductor treatment apparatus 201 treating a semiconductor device. The condition values set in the semiconductor treatment apparatus 201 are the above-described input parameters. The input parameters include, specifically, for example, a gas species, a gas flow rate, pressure, supplied power, a voltage, a current, a treatment time, a heating temperature, a cooling temperature, a dose, and a light amount.

The input unit 401 receives input of a target, value indicating a processing result of the semiconductor treatment apparatus 201 treating a semiconductor. The processing result of the semiconductor treatment apparatus 201 treating a semiconductor is the above-described output parameter. The output parameter includes, specifically, for example, a treatment result (processing result) of a semiconductor in the semiconductor treatment apparatus 201, and data regarding a state of the semiconductor treatment apparatus 201. The treatment, result of a semiconductor in the semiconductor treatment apparatus 201 includes, specifically, for example, a critical dimension (CD), a thickness of a deposited film, an etch rate (ER), a processed shape, and a mask selectivity, and wafer in-surface distribution and uniformity. The treatment result in the semiconductor treatment apparatus 201 and the data regarding a state of the semiconductor treatment apparatus 201 include, specifically, for example, a light reflection spectrum, a plasma light spectrum, a wafer incidence current, a wafer voltage, a wafer temperature, and an apparatus component temperature, and data (sensor data and monitor data) indicating a spatial distribution thereof and uniformity. The target value indicating the processing result of the semiconductor treatment apparatus 201 treating a semiconductor is a value of an output parameter of the semiconductor treatment apparatus 201, requested by a user.

The input unit 401 receives input of a reference value of a condition in a retrieval region defined by ranges of the condition (input parameter) and a processing result (output parameter). The retrieval region is defined by a control range of an input parameter and a control range of an output parameter of the semiconductor treatment apparatus 201, and is a region from which a value of the input parameter is retrieved. Specifically, for example, there is the retrieval region. A illustrated in FIG. 1. The reference value of a condition is a reference value of an input parameter. Specifically, for example, there is a value of an input parameter obtained in the past.

The input unit 401 receives input of a reference value of a processing result in the retrieval region. The reference value of a processing result is a value of an output parameter of the semiconductor treatment apparatus 201 in a case where a reference value of an input parameter is given to the semiconductor treatment apparatus 201.

The generation unit 402 generates a prediction model indicating a result between a condition and a processing result on the basis of a set value of the condition in the retrieval region and an actually measured value of the processing result in a case where the set value is given to the semiconductor treatment apparatus 201. The set value of a condition is, for example, a value of an input parameter prepared as learning data. The actually measured value of a processing result is a value of an output parameter of the semiconductor treatment apparatus 201 in a case where a value of an input parameter (a set value of a condition) prepared as learning data is given to the semiconductor treatment apparatus 201. The prediction model is a function indicating a relationship between an input parameter and an output parameter. The generation unit 402 generates a prediction model indicating a set value of a condition in the retrieval region and an actually measured value of an output through regression analysis which can cope with multi-input multi-output, such as a neural network or a support vector machine, or statistical analysis such as correlation analysis, principal component analysis, or multiple regression analysis.

The specifying unit 403 gives the target value which is input via the input unit 401 to the prediction model generated by the generation unit 402, so as to acquire a predicted value corresponding to the target value from the prediction model, and specifies a presence region of the predicted value from the retrieval region. In a case where an output parameter of the presence region of the predicted value is not acquired, the generation unit 402 acquires an actually measured value of an output in, a case where a set value of a condition in a division region is given to the semiconductor treatment apparatus 201, for each division region.

In a case where the target value is a value of an output parameter of the semiconductor treatment apparatus 201, the specifying unit 403 gives the value of the output, parameter to the prediction model, so as to acquire a value of an input parameter as a predicted value corresponding to the target value from the prediction model. The specifying unit 403 specifies a presence region of the value of the input parameter which is the predicted value from the retrieval region. Specifically, for example, in FIG. 1, in a case where the target value is the value y12 of the output parameter, predicted values corresponding to the target value y12 are values of the input parameters X1 and X2 specified by the contour line of the target value y12 in FIG. 1. Therefore, the specifying unit 403 specifies the presence regions A1, A2, A3, A8 and A9 of the values of the input parameters X1 and X2 specified by the contour line of the target value y12 from the retrieval region A.

The first determination unit 404 determines whether or not a target value corresponding to a predicted value is closer to a target value than a reference value of a processing result which is input via the input unit 401. Specifically, for example, the first determination unit 404 obtains a distance (first distance) between a target value corresponding to a predicted value and a target value, and a distance (second distance) between a reference value of a processing result and the target value, in the retrieval region A. The distances are, for example, Euclid distances. In a case where the first distance is, shorter than the second distance, the first determination unit 404 determines that the target value corresponding to the predicted value is closer to the target value than the reference value of a processing result. In a case where the first distance is not shorter than the sec on distance, the first determination unit 404 determines that the target value corresponding to the predicted value is not closer to the target value than the reference value of a processing result.

In a case where the first determination unit 404 determines that the target value corresponding to the predicted value is closer to the target value than the reference value of a processing result, the setting unit 405 sets the predicted value and the target value corresponding to the predicted value to a reference value of a condition and a reference value of a processing result, respectively, and sets the presence regions of the predicted value specified by the specifying unit 403 as retrieval regions. Consequently, a reference value approaches a target value, and a retrieval region is also narrowed to a presence region of a predicted value.

In a case where a predicted value satisfies an achievement condition for a target value, the output unit 406 outputs the predicted value satisfying the achievement condition. The achievement condition is, for example, an allowable range of a target value. The output unit 406 may display the predicted value satisfying the achievement condition on a display which is an example of the output device 304, may transmit the predicted value to an external apparatus via the communication IF 305, and may store the predicted value in the storage device 302 or the database 205.

In a case where the first determination unit 404 determines that the target value corresponding to the predicted value is not closer to the target value than the reference value of a processing result, the second determination unit 407 determines the predicted value and the target value corresponding to the predicted value as exclusion data (which will be described later in step S601 in FIG. 6). The exclusion data is a value of an input parameter which is, not permitted to be given to the prediction model.

In this case, the setting unit 405 sets data obtained by excluding the exclusion data determined by the second determination unit 407 as learning data. Consequently, the generation unit 402 can use learning data in which the exclusion data is not present. Therefore, it is possible to improve a retrieval speed for a value of, an input parameter which is a solution.

In a case where the first determination unit 404 determines that the target value corresponding to the predicted value is not closer to the target value than the reference value of a processing result, the second determination unit 407 may determine a presence region of the predicted value as an, exclusion region (which will be described later in step S602 in FIG. 6). The exclusion region is a region of a value of an input parameter which is not permitted to be output from the prediction model.

In this case, the setting unit 405 sets a residual region obtained by excluding the exclusion region determined by the second determination unit 407 from the retrieval regions, as a retrieval region. Consequently, a retrieval region can be narrowed by excluding a range of a predicted value which causes only a processing result not close to a target value to be obtained. Therefore, it is possible to improve a retrieval speed for a value of an input parameter which is a solution.

The division unit 408 divides a retrieval region into a plurality of regions. Specifically, for example, the division unit 408 divides the retrieval region A into nine regions (division regions) A1 to A9 as illustrated in FIG. 1. In this case, the generation unit 402 acquires an actually measured value of an output in a case where a set value of a condition in the division region is given to the semiconductor treatment apparatus 201, for each division region. The generation unit 402 generates a prediction model on the basis of the set value of a condition in each division region and the actually measured value of an output. By using a plurality of the semiconductor treatment apparatuses 201, actually measured values can be acquired in parallel for the respective division regions, and thus it is possible to improve a speed of generating a prediction model.

Figure 6:
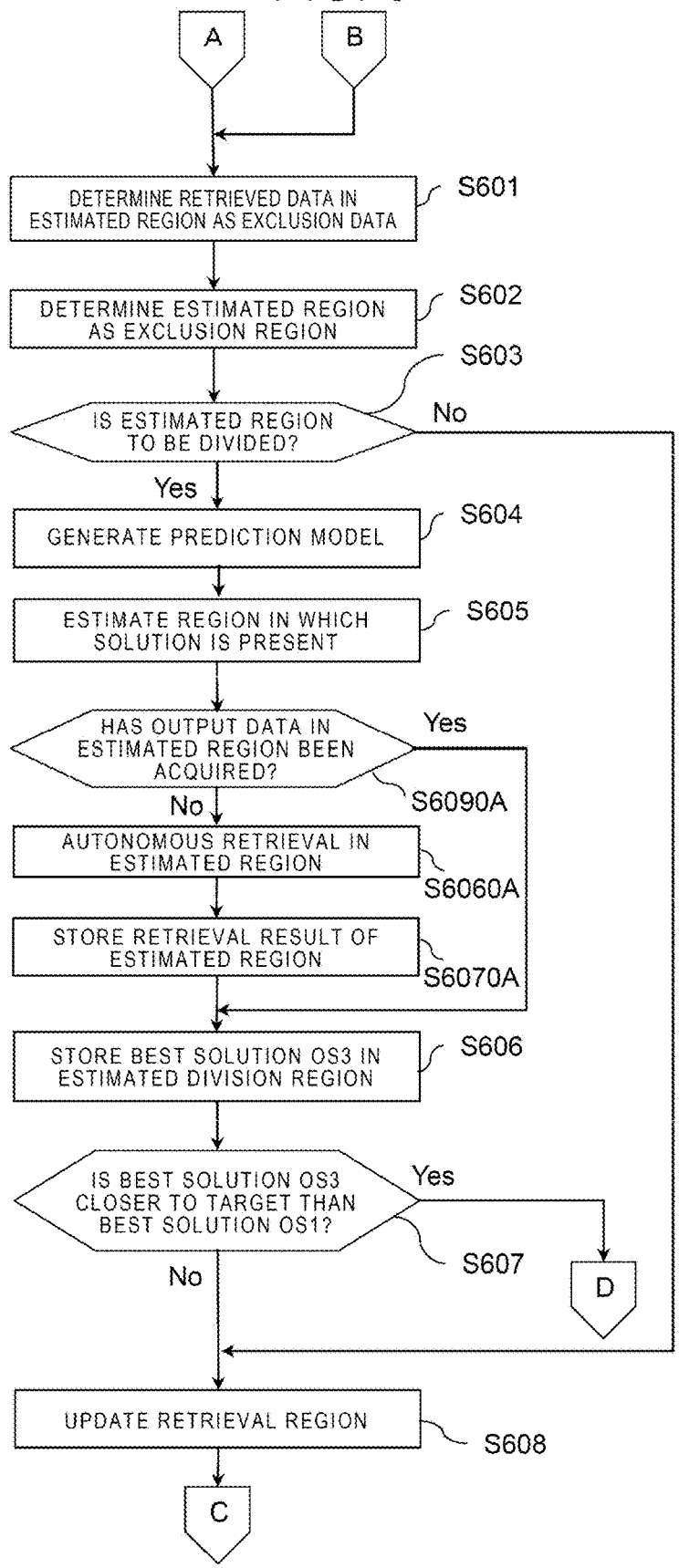
FIG. 6 illustrates Example 1 of the present invention, and is a flowchart 2 illustrating a control process procedure example for the semiconductor treatment apparatus.

In a case where the first determination unit 404 determines that the target value corresponding to the predicted value is not closer to the target value than the reference value of a processing result, the setting unit 405 may set a presence region of the predicted value as a retrieval region instead of setting the predicted, value and the target value corresponding to the predicted value as a reference value of a condition and a reference value of a processing result (which will be described later in steps S604 to S606 in FIG. 6). Consequently, a retrieval region is subdivided, a more detailed retrieval of a solution is performed, and thus it is possible to check whether or not a solution is overlooked.

Figure 7:
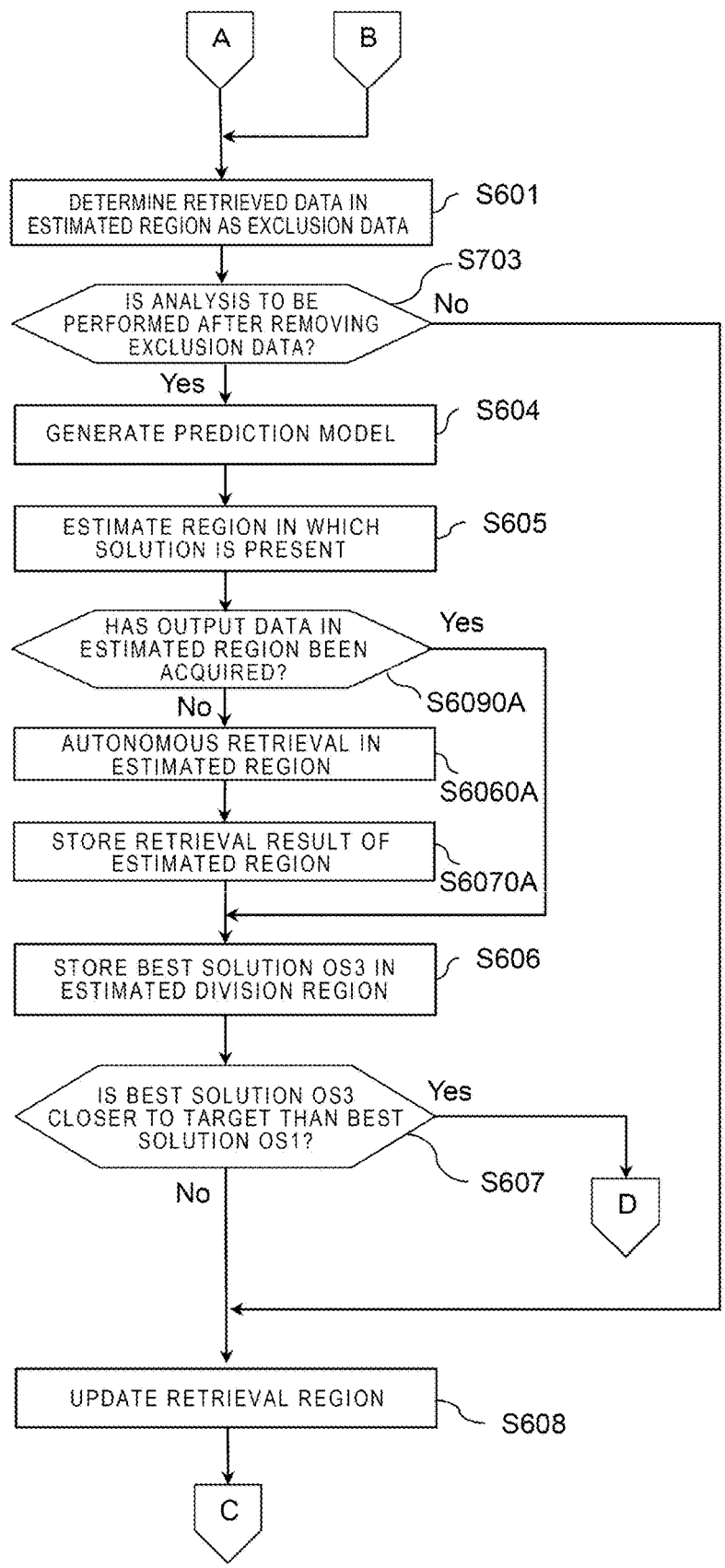
FIG. 7 illustrates Example 1 of the present invention, and is a flowchart 3 illustrating a control process procedure example for the semiconductor treatment apparatus.

As described above, in a case where the first determination unit 404 determines that the target value corresponding to the predicted value is not closer to the target value than the reference value of a processing result, the second determination unit 407 may determine the predicted value and the target value corresponding to the predicted value as exclusion data, in this case, the generation unit 402 may generate a prediction model on the basis of a residual actually measured value obtained by excluding the exclusion data from the actually measured value and a residual set value obtained by excluding a set value corresponding to the actually measured value from the set value (which will be described later in FIG. 7). Consequently, it is possible to improve a retrieval speed for a value of an input parameter which is a solution.

As described above, in a case where the first determination unit 404 determines that the target value corresponding to the predicted value is not closer to the target value than the reference, value of a processing result, the second determination unit 407 may determine a presence region of the predicted value as an exclusion region. In this case, the generation unit 402 may generate a prediction model on the basis of a set value of a condition in a residual retrieval region obtained by excluding the exclusion region from the retrieval region, and an actually measured value of an output in a case where the set value is given to the semiconductor treatment apparatus 201 (which will be described later in FIG. 8). Consequently, it is possible to improve a retrieval speed for a value of an input parameter which is a solution.

The detection unit 409 detects an unstable operation of the semiconductor treatment apparatus 201 on the basis of an output from the semiconductor treatment apparatus 201 and a predetermined output threshold value. The detection unit 409 corresponds to the unstable operation detection system 263. In this case, the output unit 406 outputs a detection result in the detection unit 409, Control Process Procedure Example in Semiconductor Treatment Apparatus 201

Figure 5:
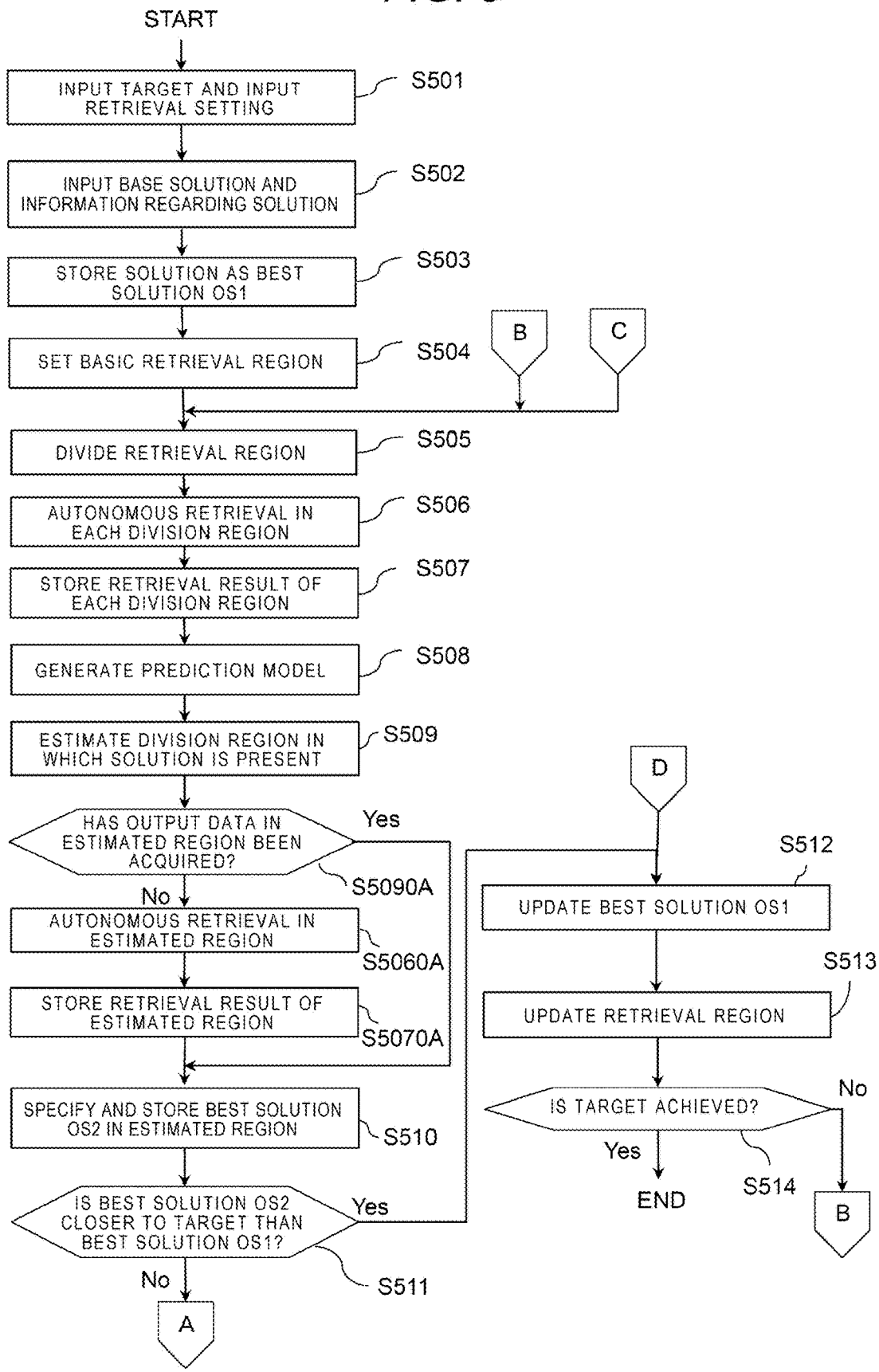
FIG. 5 illustrates Example 1 of the present invention, and is a flowchart 1 illustrating a control process procedure example for a semiconductor treatment apparatus.

FIG. 5 is a flowchart 1 illustrating a control process procedure, example for the semiconductor treatment apparatus 201. The retrieval apparatus 300 receives input of a target output value (a target value of an output parameter) from the semiconductor treatment apparatus 201 and retrieval setting (step S500). The retrieval setting, is, for example, an allowable value of a difference or deviation between a retrieval result and a target value, an upper limit of time to execute one condition in a retrieval, the number of retrievals, an upper limit of a total time for one retrieval set, an upper limit of a total time for all of the retrievals, an upper limit of an analysis time for a retrieval result, an upper limit of the number of pieces of analysis data, a threshold value of an acquisition frequency of output data from the semiconductor treatment apparatus 201, an upper limit of acquisition time for output data (a value of an output parameter) from the semiconductor treatment apparatus 201, and a lower limit of the number of pieces of output data from the semiconductor treatment apparatus 201.

Next, the retrieval apparatus 300 receives input of a solution which is a base and information regarding the solution (step S502). Specifically, for example, the retrieval apparatus 300 receives input of an input parameter actually used in the past and, an output parameter of when the input parameter was used, the best solution (a value of an input parameter) before starting a retrieval and an output parameter of when the best solution is used, a target value of an output parameter before starting a retrieval, and a model function indicating a relationship between an input parameter and an output parameter.

Next, the retrieval apparatus 300 stores the best solution which is input in step S502 as the best solution OS1 (step S503). In a case, where there is no solution, a system or a value indicating the fact of being farthest from a solution is set.

Next, the retrieval apparatus 300 sets a basic retrieval region as a retrieval region (step S504). Specifically, for example, the retrieval apparatus 300 sets whether or not each input parameter is to be retrieved, an upper limit value and a lower limit value of a control range of a retrieved input parameter, and a value (for example, an upper limit value or a lower limit value) for restricting a control range of a retrieved input parameter. The retrieval apparatus 300 determines a retrieval region by referring to a control range of an input parameter which is determined as being a setting error by the setting error detection system 223. The retrieval apparatus 300 determines a retrieval region by referring to a parameter which is detected by the unstable operation detection system 263. The unstable operation detection system 263 holds a combination of input parameters or a value of each input parameter range which caused an operation of the semiconductor treatment apparatus 201 to be impossible or unstable in the past, and the retrieval apparatus 300 may determine a retrieval region by using the value.

For example, in a case where the two input parameters X1 and X2 are, selected as input parameters in FIG. 1, if a control range of the input parameter X1 is set to [x11,x1$n$], and a control range of the input parameter X2 is set to [x21,x2$n$], the region A of the entire range illustrated in FIG. 1 is a retrieval region.

The input and the set content for the target setting controller 261 in steps S501 to S504 are delivered to the autonomous retrieval system 262, and an automatic retrieval is performed according to procedures ire steps S505 to S510 described next.

The retrieval apparatus 300 divides the retrieval region (step S505). Specifically, for example, the retrieval apparatus 300 divides a control range of an input parameter which can be retrieved into two or more regions with respect to one or more input parameters. A region obtained through the division will be referred to as a division region. In a case where it is predicted that the number of retrieval conditions increases, and thus a retrieval cannot be completed within a desired time, the retrieval region can be restricted or, the number of retrieval conditions can be reduced by using a method of designating a division region in which a solution is estimated to be present or a method of designating input parameters which can be changed at a time with respect to some of the input parameters. It is possible to restrict the retrieval region or to reduce the number of retrieval conditions by combining the two methods with each other.

For example, in FIG. 1, in a case where the two input parameters X1 and X2 are selected as input parameters, if the control range [x11,x1n] of the input parameter X1 is divided into x1a, x1b, and x1c, and the control range [x21,x2n] of the input parameter X2 is divided into x2a, x2b, and x2c, the nine division regions A1 to A9 illustrated in FIG. 1 are obtained.

The retrieval apparatus 300 performs an autonomous retrieval for each division region (step S506). Specifically, for example, the retrieval apparatus 300 acquires input and output data for the semiconductor treatment apparatus 201 in each retrieval condition as a retrieval result through the autonomous retrieval using the division regions and the retrieval conditions. The input, and output data is a set of a value of an input parameter (input data) given to the semiconductor treatment apparatus 201 and a value of an output parameter (output data) obtained from the semiconductor treatment apparatus 201.

Specifically, the for example, the retrieval apparatus 300 selects a value of an input parameter satisfying the retrieval conditions for each division region, and gives the selected value of the input parameter to the semiconductor treatment apparatus 201. The retrieval apparatus 300 acquires output data (a value of an output parameter) from the semiconductor treatment apparatus 201. A combination of the value of the input parameter and the value of the output parameter corresponding to the value is a retrieval result.

In this case, the unstable operation detection system 263 detects a case where the semiconductor treatment apparatus 201 can continuously perform treatment, but treatment in the semiconductor treatment apparatus 201 is unstable, during execution of the autonomous retrieval. In a case where an unstable operation is detected, the autonomous retrieval is continuously performed by the target setting controller 261 by executing a sequence for recovering the semiconductor treatment apparatus 201 to a normal operation state after treatment completion, or by immediately stopping treatment and executing a sequence for recovering the semiconductor treatment apparatus 201 to a normal operation state.

The retrieval apparatus 300 stores a retrieval result in each division region in the database 205 (step S507). Specifically, for example, the retrieval apparatus 300 stores input and output data which is a set of a value of an input parameter used for the autonomous retrieval (step S506) and a value of an output parameter of the semiconductor treatment apparatus 201 acquired by using the value of the input parameter for each division region, in the database 205 as a retrieval result in each division region.

The retrieval apparatus 300 generates a prediction model for predicting a solution (input parameter) satisfying a target (target output) (step S508). Specifically, for example, the retrieval apparatus 300 generates, as the prediction model, a function indicating a relationship between input and output data for the, semiconductor treatment apparatus 201 by using the learning data stored in the database 205 in step S507. As a method of analyzing a relationship between input and output data, regression analysis which can cope with multi-input multi-output, such as regression using a neural network, support vector regression, or a kernel method, may be used. Statistical analysis such as correlation analysis, principal component analysis, or multiple regression analysis may be used.

In generation of the prediction model, for example, sensor data and monitor data for acquiring an indirectly measured value for a treatment result in the semiconductor treatment apparatus 201 are used as output data. There is a case where an acquisition frequency for output data is lower than a frequency defined in the retrieval setting, or acquisition time is longer than an acquisition time defined in the retrieval setting, and the number of pieces of output data which can be acquired through a retrieval is smaller than the number of pieces of output data defined in the retrieval setting. In this case, the sensor data and the monitor data may be acquired such that the number of pieces of data is larger than the number of pieces of acquired output data. Consequently, it is possible to analyze a relationship of sensor data and monitor data for the output data, or a relationship of input data for the sensor data and the monitor data. It is possible to obtain a relationship of the input data for the output data by using both of the analysis results.

The retrieval apparatus 300 estimates a division region in which a solution is present (step S509). In a case where output data in the region in which a solution is estimated to be present has been acquired (step S5090A: Yes), the retrieval apparatus 300 specifies the best solution OS2 from the estimated division region, and stores the specified best solution OS2 in the database 205 (step S510). In a case where output, data in the region in which a solution is estimated to be present is not acquired (step S5090A: No), the retrieval apparatus 300 performs autonomous retrieval in the estimated region (step S5060A), so as to acquire output data in the region in which a solution is estimated to be present, that is, a retrieval result, and stores the retrieval result in the database 205 (step S5070A). The autonomous retrieval and the storing of the result are the same as the processes in steps S506 and S507. The process in step S509 has two methods. The first method is a method (first estimation method) of giving the target value of the output parameter given in step S501 to the prediction model.

In the first estimation method, specifically, for example, the retrieval apparatus 300 assigns the target value of the output parameter given in step S501 to the, prediction model obtained in step S508, so as to estimate input data (a value of the input parameter) which is a solution satisfying the target value of the output parameter. The retrieval apparatus 300 specifies a division region in which the input data serving as a solution is present. For example, in a case where the prediction model is a function indicating, the input-output relationship in FIG. 1, if y6 is given as the target value of the output parameter, among the division regions A1 to A9, three division regions A1, A4 and A7 are estimated as division regions in which a solution is present. In a case where output data is not acquired in each of the division regions A1, A4 and A7 as described above, step S5060A and step S5070A are executed.

In step S510, the retrieval apparatus 300 specifies a division region in which the same output data as the target value y6, a division region in which output data having a difference or deviation between the output data and the target value smaller than the allowable value (the allowable value given in step S501) is present, or a division region in which output data closest to the target value y6 is present by using the acquired output data, and determines the division region as a region (hereinafter, a specific division region) in which the best solution OS2 is present. In a case where a plurality of division regions are specified as specific division regions, the retrieval apparatus 300 determines all of the regions as division regions in which the best solution OS2 is present. Alternatively, the retrieval apparatus 300 determines a division region in which the number of pieces of output data having a difference or deviation between the output data and the target value smaller than the allowable value (the allowable value given in step S501) is largest, as a division region in which the best solution OS2 is present. In a case of the above example, if the acquired output data is the same as in FIG. 1 indicated by the prediction model, all of the division regions A1, A4 and A7 or the division region A4 in which a value which is the same as or close to v6 is obtained, as a specific division region. The retrieval apparatus 300 determines a value of an input parameter of when output data which is the same as the target value of the output parameter in the specific division region, output data having a difference or deviation between the output data and the target value smaller than the allowable value (the allowable value given in step S501), or output data closest to the target value is obtained, as the best solution OS2.

The other method of the process in step S509 is a method (second estimation method) which is applicable in a case where a input parameter serving as a solution satisfying the target value of the output parameter is not directly obtained by assigning the target value of the output parameter given in step S501 to the prediction model. The second estimation method is a method in which a plurality of sets of input parameters are given to the prediction model with input parameters given to the prediction model at a time as a set, so that an estimated output parameter is computed, and a set of input parameters causing a processing result closest to a target output to be obtained is acquired. For example, the retrieval apparatus 300 may create one or more sets of input parameters included in each division region with respect to each division region, and may give the sets of input parameters to the prediction model so as to compute an output parameter at this time. Regarding a method of obtaining a representative estimated output of each division region, values of central coordinates in the division region may be used as a set of input parameters.

In a case where a large number of sets of input parameters are given to the prediction model, and an estimated output is computed, if a computation time considerably increases, as described by using the above Equations (1.1) to (1.3), the retrieval apparatus 300 determines a central condition of an input parameter given to the prediction model, and restricts an input parameter which can be changed from the central condition, so as to be able to restrict a computation time. It is possible to reduce a computation time by restricting the number of input parameters which can be changed from the central condition at a time. Consequently, the retrieval apparatus 300 can obtain an input parameter causing a result close to a target output to be obtained while reducing the number of sets of input parameters given to the prediction model. A past retrieval result or knowledge of an engineer may be used to predict the central condition. Alternatively, central coordinates of the entire retrieval region, may be used as a central condition.

In the second estimation method, specifically, the retrieval apparatus 300 assigns values of a set of input parameters to the prediction model obtained in step S508, so as to acquire a value of an output parameter which is a predicted value. For example, in a case where the prediction model is a function indicating the input-output relationship in FIG. 1, if (x11,x21), (x11,x22), (x11,x23), (x12,x21), (x12,x22), (x12,x23), (x13,x21), (x13,x22), (x13,x23), (x1$n$,x21), (x1$n$,x22) and (x1$n$,x23) are given to the prediction model as values of input parameters, an estimated output parameter corresponding to each input parameter can be obtained.

In a case where an output parameter corresponding to each input parameter is, not acquired (step S5090A: No), the retrieval apparatus 300 performs analysis result by using each input parameter (step S5060A), so as to acquire output data in the region in which a solution is estimated to be present, that is, a retrieval result, and stores the retrieval result in the database 205 (step S5070A). The autonomous retrieval and the storing of the result are the same as the processes in steps S506 and S507. In a case where an output parameter corresponding to each input parameter has been acquired (step S5090A: Yes), the flow proceeds to step S510.

In step S510, for example, the retrieval apparatus 300 determines, as the best solution OS2, a value of an input parameter causing a value of an output parameter as a predicted value closest to the target value of the output parameter to be obtained in a division region. For example, in a case where the acquired output data is the same as in FIG. 1 indicated by the prediction model, if the target value of the output parameter is y10, the value y10 of the output parameter corresponding to values (x13,x23) of input parameters is the closest value. Therefore, the best solution OS2 is (x13,x23). Of the first estimation method and the second estimation method, an applied method is set in advance.

The retrieval apparatus 300 determines whether or not a value of an output parameter corresponding to the best solution OS2 is a solution which is closer to the target than a value of an output parameter corresponding to the best solution OS1 (step S511). In a case where a value of an output parameter corresponding to the best solution OS2 is a solution which is closer to the target than a value of an output parameter corresponding to the best solution OS1 (step S511: Yes), the flow proceeds to step S512, and if otherwise (step S511: No), the flow proceeds to step S601 (FIG. 6).

In a case of Yes in step S511, the retrieval apparatus 300 sets the best solution OS2 as the best solution OS1 so as to update the best solution OS4 (step S512). The retrieval apparatus 300 sets the division region of the updated best solution OS1 as a retrieval region, so as to update the retrieval region (step S514).

Next, the retrieval apparatus 300 determines whether or not the target is achieved (step S514). In a case where the target is achieved (step S514: Yes), the retrieval apparatus 300 finishes the control process. On the other hand, in a case where the target is not achieved (step S514: No), the flow proceeds to step S505 or step S601 (FIG. 6). Proceeding to step S505 or step S601 (FIG. 6) may be set in advance, and may be selected by a user. In a case where the target is not achieved (step S514: No), and the flow proceeds to step S505, the retrieval apparatus 300 divides the retrieval region updated in step S513 (step S505).

In step S514, specifically, for example, in a case where an output parameter corresponding to the updated best solution OS1 is the same as the target value or a difference from the target value is within an allowable range, the retrieval apparatus 300 determines that the target is achieved (step S514: Yes). Even if a case where an output parameter corresponding to the updated best solution OS1 is not the same as the target value or a difference from the target value is not within an allowable range, in a case where the retrieval time set in step S501 has elapsed, the retrieval apparatus 300 determines that the target is achieved (step S514: Yes). In a case where am output parameter corresponding to the updated best solution OS1 is not the same as the target value or a difference from the target value is not within an allowable range, and the retrieval time set in step S501 has not elapsed, the retrieval apparatus 300 determines that the target is not achieved (step S514: No).

FIG. 6 is a flowchart illustrating a control process procedure example for the semiconductor treatment apparatus 201. The retrieval apparatus 300 determines retrieval data in the division region obtained in step S500 as exclusion data (step S601). Specifically, for example, the retrieval apparatus 300 determines input data (a value of an input parameter) and output data (output parameter) in the estimated region as exclusion data. The exclusion data is data which may possibly be excluded in the subsequent process exclusion from actual analysis object data is performed in step S703 in FIG. 7 or in step S608 in FIGS. 6 to 8). Similarly, the retrieval, apparatus 300 determines the division region obtained in step S510 as an exclusion region (step S602). The exclusion region is a region which may possibly be excluded in the subsequent process (exclusion from actual analysis object data is performed in step S803 in FIG. 8 or in step S608 in FIGS. 6 to 8).

Next, the retrieval apparatus 300 determines whether or not the division region obtained in step S509 is to be divided (step S603). In a case where, the division region is to be divided (step S603: Yes), the flow proceeds to step S604, and in a case where the division region is not to be divided (step S603: No), the flow proceeds to step S608.

In step S603 specifically, for example, the retrieval apparatus 300 determines whether or not the division region is to be divided depending on whether or not a division instruction is input from the user. The retrieval apparatus 300 may force the division region to be divided (step S603: Yes).

Next, the retrieval apparatus 300 generates a prediction model in the same manner as in step S508 (step S604). Next, the retrieval apparatus 300 estimates a division region in which a solution is present in the division region group obtained through the division in step S603 in the same manner as in step S509 (step S605). The division region which is estimated will be referred to as an estimated division region. The retrieval apparatus 300 performs the same processes as those in steps S5090A, S5060A and S5070A in steps S6090A, S6060A and S6070A. Specifically, for example, in a case where output data in the region in which a solution is estimated to be present has been acquired (step S6090A: Yes), the retrieval apparatus 300 specifies the best solution OS3 from the estimated division region, and stores the specified best solution OS3 in, the database 205 (step S606). Similarly, in a ease where output data in the region in which a solution is estimated to be present is not acquired (step S6090A: No), the retrieval apparatus 300 performs an autonomous retrieval in the estimated region (step S6060A), so as to acquire output data, in the region in which a solution is estimated to be present, that is, a retrieval result, and stores the retrieval result in the database 205 (step S6070A).

Next, in the same manner as in step S511, the retrieval apparatus 300 determines whether or not a value of an output parameter corresponding to the best solution OS3 is a solution which is closer to the target than a value of an output parameter corresponding to the best solution OS1 (step S607). In a case where a value of an output parameter corresponding to the best solution OS3 is a solution which is closer to the target than a value of an output parameter corresponding to the best solution OS1 (step S607: Yes), the flow proceeds to step S512, and if otherwise (step S607: No), the flow proceeds to step S608. In step S608, the retrieval apparatus 300 excludes the exclusion region from the retrieval region, or excludes the exclusion region and the exclusion data therefrom, so as to update the retrieval region (step S608), and proceeds to step S505.

FIG. 7 is a flowchart 3 illustrating a control process procedure example for the semiconductor treatment apparatus 201. The flowchart 3 illustrates a process example which is different from that illustrated in the flowchart 2 of FIG. 6. The same process as in FIG. 6 is given the same, step number, and a description thereof will be omitted. After step S601, the retrieval apparatus 300 determines whether or not the exclusion data determined in step S601 is to be excluded (step S703). In a case where the exclusion data is excluded, and analysis is performed (step S703: Yes), the flow proceeds to step S604, and, in a case where analysis is performed without excluding the exclusion data (step S703: No), the flow proceeds to step S608.

In step S703, specifically, for example, the retrieval apparatus 300 determines whether or not the division region is to be divided depending on whether or not a division instruction is input from the user. The retrieval apparatus 300 may force the exclusion data to be excluded and then perform analysis (step S703: Yes).

Next, the retrieval apparatus 300 generates a prediction model for the division region without using the exclusion data (step S604), and executes steps S605, S6090A, S6060A, S6070A, S606, S607 and S608.

Figure 8:
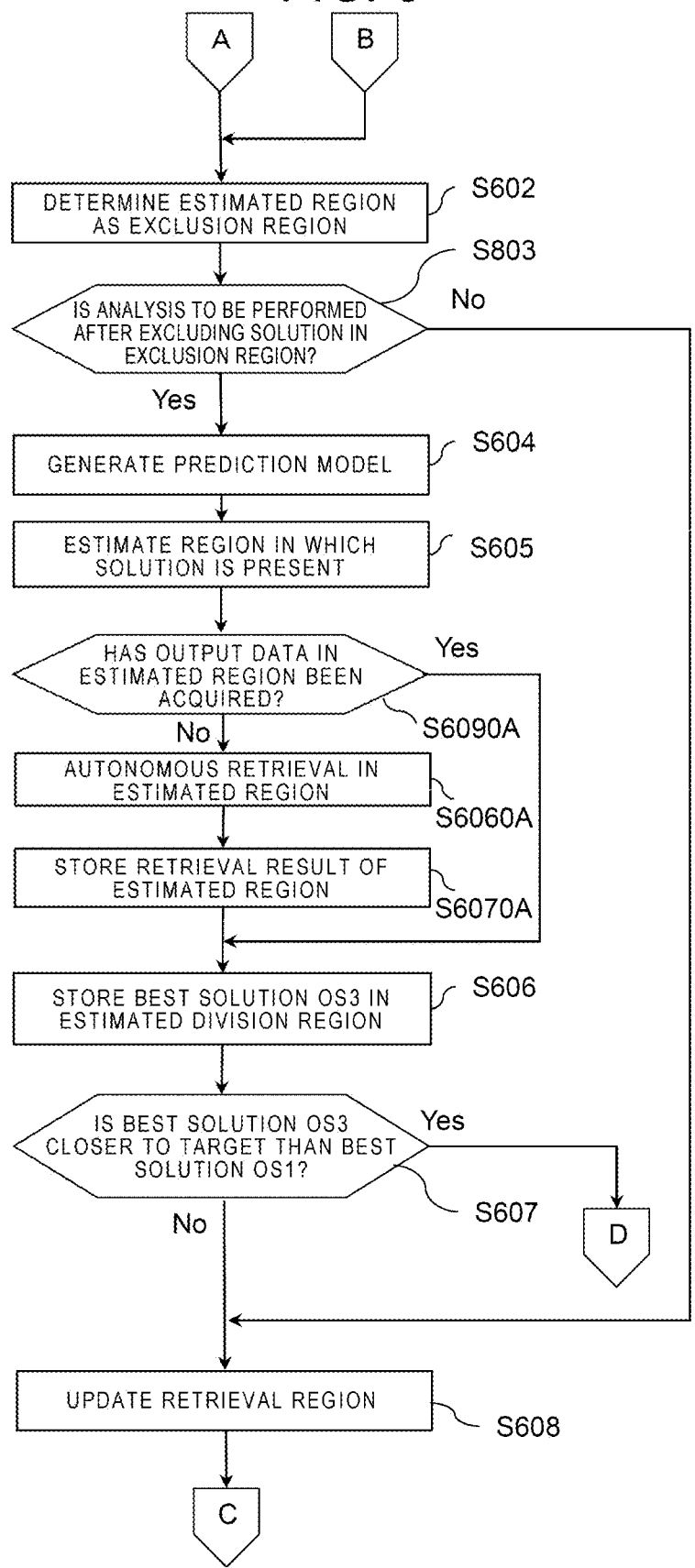
FIG. 8 illustrates Example 1 of the present invention, and is a flowchart 4 illustrating a control process procedure example for the semiconductor treatment apparatus.

FIG. 8 is a flowchart 4 illustrating a control process procedure example for the semiconductor treatment apparatus 201. The flowchart 4 illustrates a process example which different from that illustrated in the flowchart 2 of FIG. 6. The same process as in FIG. 6 is given the same step number, and a description thereof will be omitted. After step S602, the retrieval apparatus 300 determines whether or not analysis is to be performed after excluding the exclusion region determined in step S602 (step S803). In a case where the exclusion region is excluded, and analysis is performed (step S803: Yes), the flow proceeds to step S604, and, in a case where analysis is performed without excluding the exclusion region (step S803: No), the flow proceeds to step S608.

En step S803, specifically for example, the retrieval apparatus 300 determines whether or not analysis is to be performed after a solution (a value of an input parameter) in the exclusion region depending on whether or not a division, instruction is, input from the user. The retrieval apparatus 300 may force the exclusion region to be excluded and then perform analysis (step S803: Yes).

Next, the retrieval apparatus 300 generates a prediction model for the division region the same manner as in step S604 (step S604). Next, the retrieval apparatus 300 estimates a division region in which a solution is present among the division regions divided in step S603 without using a solution (a value of an input parameter) in the exclusion region (step S605). The division region which is estimated will be referred to as an estimated division region. The retrieval apparatus 300 executes steps S6090A, S6060A, S6070A, S606, S607 and S608.

In the present control process, in a case where the scales of analysis, storing, transmission, and the like of data are increased, and thus execution times thereof are longer than the time to retrieve one condition, a retrieval can be continuously performed in parallel to the execution. In this case, one or more of the number of input parameters changed in a retrieval condition, the lumber of input parameters changed simultaneously, and the division number of a retrieval region are increased. Consequently, the number of retrieval conditions are, increased, and a retrieval is performed by using the conditions. Thus, it is possible, to increase the number of retrieval results by using the time to perform analysis and the like. Particularly, there is a case where the time required for analysis of data is several minutes to several hours, and a retrieval is continuously performed during the analysis such that a retrieval speed can be improved.

Application Example 1 of Control Process for Semiconductor Treatment Apparatus 201

Next, a description will be made of an application example of a control process for correcting an apparatus difference in the semiconductor treatment apparatus 201 in maintenance of the semiconductor treatment apparatus 201 before mass production of semiconductor devices. Herein, as an example of describing procedures of apparatus difference suppression, the semiconductor treatment apparatus 201 is an etching, apparatus performing a discharge process. Here, an input parameter of when the discharge process is performed will be referred to as a recipe. In the etching apparatus performing the discharge process, an output which is a correction object may be a treatment result or a characteristic of discharge used for treatment. A correction method is a method of correcting another etching apparatus such that the same output as in a reference etching apparatus is obtained, or a method of correcting a plurality of etching apparatuses such that outputs therefrom are uniform.

Figure 9:
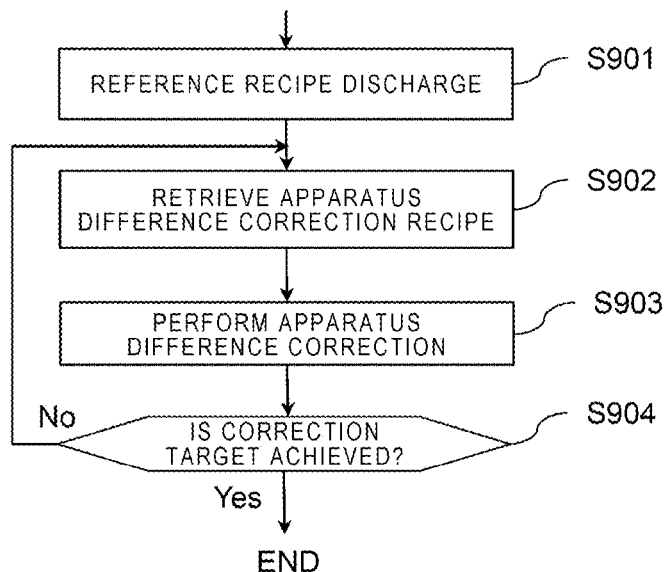
FIG. 9 illustrates Example 1 of the present invention, and is a flowchart illustrating apparatus difference suppression method.

FIG. 9 is a flowchart illustrating an apparatus difference suppression method. FIG. 9 illustrates, specifically, for example, a maintenance process procedure example for the semiconductor treatment apparatus 201 before mass production of semiconductor devices, and the retrieval apparatus 300 starts to acquire discharge data after maintenance in order to correct an apparatus difference.

First, the retrieval apparatus 300 performs reference recipe discharge by using a recipe for performing a fundamental discharge process, and acquires input and output data at this time. The, retrieval apparatus 300 performs discharge by using a recipe used for mass production, and acquires output data (a value of an output parameter) at this time (step S901), The process in step S901 corresponds to the processes in steps S501 to S504.

Next, the retrieval apparatus 300 retrieves an apparatus difference correction recipe (step S902). The process in step S902 corresponds to the processes in steps S505 to S507. The retrieval apparatus 300 performs apparatus difference correction by using the apparatus difference correction recipe retrieved in step S902 (step S903). The process in step S903 corresponds to the processes in steps S508 to S513 and FIGS. 6 to 8. In a case where a correction target is not achieved (step S904: No), the flow returns to step S902, and, in a case where the correction target is achieved (step 904: Yes), the, process is finished. The process in step S904 corresponds to the, process in step S514.

Retrievals may be performed in parallel by using a plurality of etching apparatuses performing the same mass production process, and thus a retrieval speed is improved. In this case, it is possible to increase a possibility that a solution satisfying a target can be retrieved by using a plurality of etching apparatuses in which an apparatus difference is corrected according to the procedures in FIG. 9. It is possible to perform correction by developing the retrieved solution in the plurality of apparatuses.

As mentioned above, the retrieval apparatus 300 perform a retrieval method after maintenance of the semiconductor treatment apparatus 201, and thus it is possible to cause a value of an output parameter of the semiconductor treatment apparatus 201 to be close to a reference value of an output parameter (automatic apparatus difference correction function).

Application Example 2 of Control Process for Semiconductor Treatment Apparatus 201

Next, a description will be made of an application example of a control process for correcting a temporal change in a mass production process of semiconductor devices.

Figure 10:
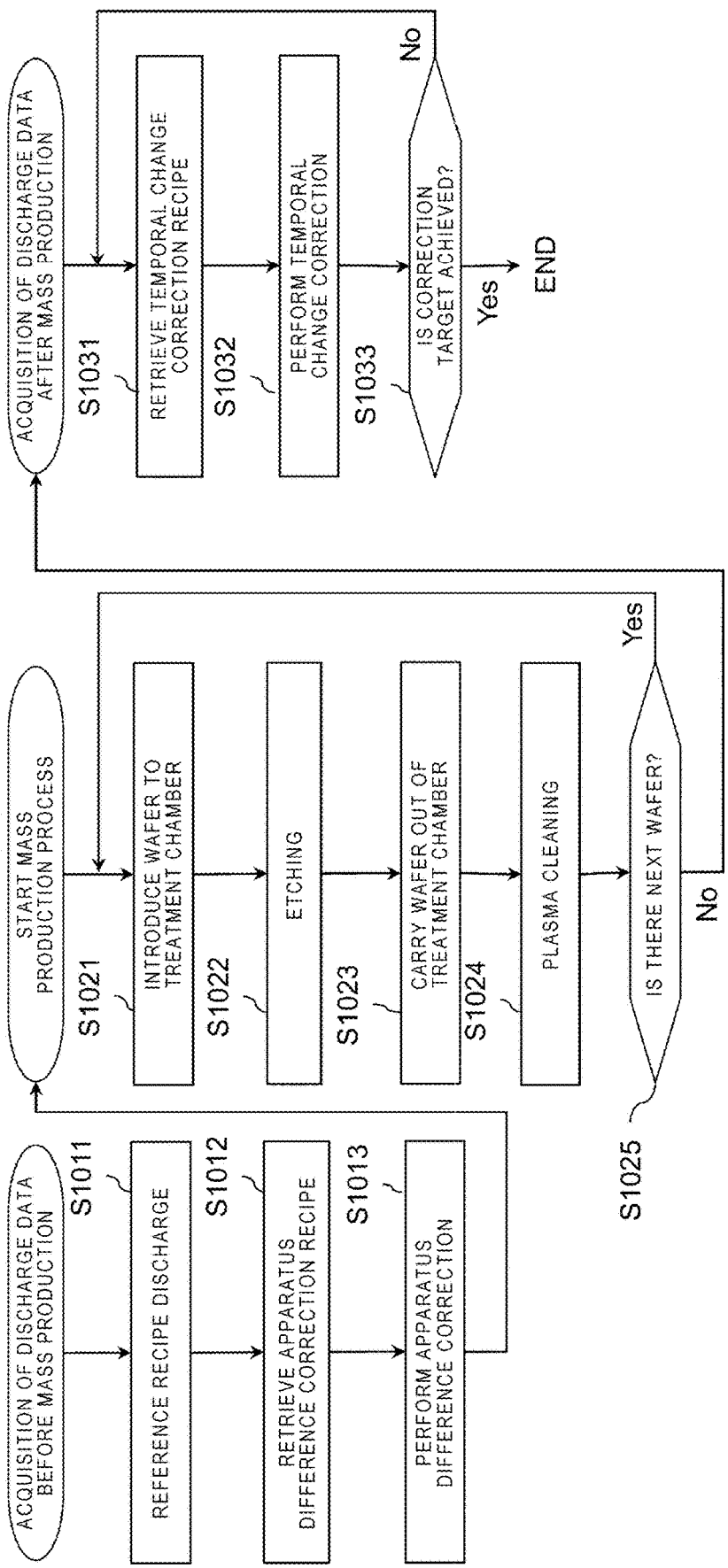
FIG. 10 illustrates Example 1 of the present invention, and is a flowchart illustrating a temporal change correction method.

FIG. 10 is a flowchart illustrating a technique correction method. In FIG. 10, in the same manner as in FIG. 9, as an example of describing procedures of correcting a temporal change, the semiconductor treatment apparatus 201 is an etching apparatus which uses discharge for treatment. In data acquisition before mass production, in order to correct a technique during mass production, first, the retrieval apparatus 300 gives a reference recipe for performing a fundamental discharge process to, the etching apparatus to perform reference recipe discharge, and acquires output data (a value of an output parameter) at this time (step S1011). The process in step S1011 corresponds to the processes in steps S501 to S504.

Next, the retrieval apparatus 300 retrieves an apparatus difference correction candidate recipe (step S1012). In step S1012, there is the use of output data, or sensor data an d monitor data causing a temporal change of a correction object to be predicted on the basis of analysis results of input and output data in the past mass production. The retrieval apparatus 300 retrieves an apparatus difference correction candidate recipe for applying the data causing such a temporal change to be expected to a value after the temporal change in the etching apparatus before starting mass production. The process in step S1012 corresponds to the processes in steps S505 to S507.

Next, the retrieval apparatus 300 performs apparatus difference correction (step S1013). In step S1013, the retrieval apparatus 300 compares a fundamental mass production recipe used in a state in which a temporal change does not occur with the apparatus difference correction candidate recipe retrieved in step S1012, so as to clarify an input parameter changed by the apparatus difference correction candidate recipe. Consequently, it is possible to generate a function indicating a relationship between an input parameter and an output parameter of a correction object in the stage of mass production, and also to generate a recipe which is a correction candidate on the basis of the relationship. The process, in step S1013 corresponds to the processes in steps S508 to S513 and FIGS. 6 to 8. Subsequently, a mass production process is started.

After step S1013, if the mass production of semiconductor devices is started, a wafer is introduced into a treatment chamber (step S1021), and the etching apparatus etches the wafer (step S1022). The etching (step S1022) is formed of one step or a plurality of steps. In a case where the etching (step S1022) is formed of a plurality of steps, etching in each step is performed while changing a discharge condition. After the etching (step S1022) is completed, the wafer is carried out of the treatment chamber (step S1023). Plasma cleaning is performed to remove a reaction product generated during the etching and deposited on a treatment chamber surface (step S1024). In a case where there is the next wafer (step S1025: Yes), the flow returns to step S1021, and, in a case where there is no next wafer (step S1025: No), the flow proceeds to discharge data acquisition after mass production.

Input and output data for the etching apparatus during mass production are stored in the database 205, and the retrieval apparatus 300 continuously analyzes the input and output data in parallel in real time. Consequently, it is possible to continuously estimate output data or sensor data and monitor data causing a temporal change of a correction object to be predicted during mass production. The retrieval apparatus 300 collects input and output data for a plurality of etching apparatuses performing the same mass production process, so as to be able to increase the number of pieces of data.

In a case where discharge data is acquired after mass production or after designated time elapses from the starting of the mass production, the retrieval apparatus 300 retrieves a recipe for correcting a temporal change (step S1031). Specifically, for example, the retrieval apparatus 300 retrieves a temporal change correction recipe by using the data acquired in steps S1011 and S1012, an analyzed relationship between input, and output data, the correction candidate recipe as inputs in step S502. The process in step S1031 corresponds to the processes in steps S505 to S507.

The retrieval apparatus 300 performs verification of a correction result by using the temporal change correction recipe which is a retrieval result (step S1032). The process in step S1032 corresponds to the processes in steps S508 to S513 and FIGS. 6 to 8.

Before execution of steps S1031 and S1032, the retrieval apparatus 300 may estimate output data or sensor data and monitor data causing a temporal change of a correction object to be predicted by using output data acquired during mass production of semiconductor devices, and may execute step S1012. Consequently, it is possible to generate a function indicating a relationship between an input parameter and an output parameter of a correction object, and also to generate a recipe which is a correction candidate on the basis of the relationship. The retrieval apparatus 300 can execute steps S1031 and S1032 by using the result in step S502.

As inputs in step S502 in the retrieval, there may be the use of a recipe obtained by changing an input parameter which is frequently used for correction by using knowledge of an engineer, and output data and an analysis result thereof of when discharge is performed by using the recipe.

In a case where correction target is not achieved (step S1033: No), the flow returns to step S131, and, its a case where the correction target is achieved (step S1033: Yes), the process is finished. The process in step S1033 corresponds to the process in step S514. In a case where the retrieval illustrated in FIG. 10 performed, retrievals are performed in parallel by using a plurality of etching apparatuses after mass production having performed the same mass production process, and thus it is possible to improve a retrieval speed. A retrieved solution (input parameter) can be developed to a plurality of etching apparatuses performing the same mass production process, and correction be performed.

As mentioned above, the retrieval apparatus 300 performs a retrieval method after mass production of semiconductors, and thus it is possible to correct a temporal change in a value of an output parameter of the semiconductor treatment apparatus 1 during mass production (automatic temporal change correction function).

As mentioned above, the retrieval apparatus 300 automatically analyzes a value of an input parameter and a value of an output ammeter of the semiconductor treatment apparatus 201, and automatically determines a test condition for retrieving the value of the input parameter by taking into consideration analysis result. The retrieval apparatus 300 automatically performs verification of a test result, and repeatedly performs the automatic operations, so as to be able to automatically a value of an input parameter causing a target apparatus state and a target treatment result (a value of an output parameter) to be obtained. Consequently, the semiconductor treatment apparatus 201 can extract apparatus, performance for itself, and can also support an engineer who performs control model development or selection of apparatus parameters (a combination of an input parameter and an output parameter) for extracting the apparatus performance.

As described above, the retrieval apparatus 300 according to the present example includes the input unit 401 which receives input of a target value indicating a condition set in the semiconductor treatment apparatus 201 treating a semiconductor or a processing result of the semiconductor treatment apparatus 201 treating a semiconductor, and a reference value of the condition or the processing result in a retrieval, region defined in ranges of the condition and the processing result, indicated by the target value; the generation unit 402 which generates a relationship between the condition and the processing, result on the basis of a set value of the condition in the retrieval region and an actually measured value of the processing result in a case where the set value is given to the semiconductor treatment apparatus 201; the specifying unit 403 which gives the target value input via the input unit 401 to the prediction model generated by the generation unit 402 so as to acquire a predicted value from the prediction model, and specifies a presence region of the predicted value from the retrieval region; the first determination unit 404 which determines whether or not an actually measured value of the processing result corresponding to the predicted value is closer to the target value than the reference value input via the input unit 401; the setting unit 405 which sets the predicted value as a reference value, and sets the presence region of the predicted value specified by the specifying unit as a retrieval region, in a case where the first determination unit 404 determines that the actually measured value of the processing result corresponding to the predicted value is closer to the target value; and the output unit 406 which outputs the predicted value satisfying an achievement condition in a case where the actually measured value of the processing result corresponding to the predicted value satisfies the achievement condition for the target value.

Consequently, it is possible to improve the accuracy of reaching the best solution regarding input and output for the semiconductor treatment apparatus 201. Therefore, it is possible to make an operation of the semiconductor treatment apparatus 201 efficient and to optimize treatment therein.

In the retrieval apparatus 300, in a case where the first determination unit 404 determines that the actually measured value of the processing, result corresponding to the predicted value obtained from the prediction model is not closer to the target value, the second determination unit 407 determines the predicted value in the presence region of the predicted value and the actually measured value of the processing result corresponding to the predicted value as exclusion data, and the setting unit 405 sets a residual region obtained by excluding an exclusion region specified by the exclusion data and the target value given to the semiconductor treatment apparatus 201 in a case where the exclusion data is obtained from the retrieval region, as a retrieval region. Consequently, it is possible to exclude an exclusion region in which a combination of a predicted value not close to a target value and the target value is present from the latest retrieval region, and thus to improve the accuracy of reaching the best solution.

In the retrieval apparatus 300, the division unit 408 divides the retrieval region into a plurality of regions, and, in a case where the first determination unit 404 determines that the actually measured value of the processing result corresponding to the predicted value is closer to the target value, the specifying unit 403 sets the predicted value as a reference value, and specifies a presence region of the predicted value among a plurality of division regions. Consequently, it is possible to easily specify a presence region of a predicted value, and thus to improve a retrieval speed.

In the retrieval apparatus 300, the division unit 408 divides the retrieval region into a plurality of regions, and the generation unit 402 acquires an actually measured value of a processing result in a case where a set value of a condition in a division region is given to the semiconductor treatment apparatus 201 for each division region. The generation unit 402 generates a prediction model on the basis of the set value of the condition in each division region and the actually measured value of the processing result. Consequently, it is possible to acquire actually measured values for the respective division regions in parallel by using a plurality of the semiconductor treatment apparatuses 201, and thus to increase a speed of generating a prediction model.

In the retrieval apparatus 300, in a case where the first determination unit 404 determines that the actually measured value of the processing result corresponding to, the predicted value is not closer to the target value, the second determination unit 407 determines data acquired in the presence region of the predicted value as exclusion data, and the generation unit 402 generates a prediction model on the basis of a specific actually measured value obtained by excluding the exclusion data from the actually measured value, and a specific set value obtained by excluding a set value given, to the semiconductor treatment apparatus 201 in a case where the exclusion data is obtained from the set value. It is possible to exclude an exclusion region in which a predicted value not close to a target value and a set value from a candidate of a predicted value, and thus to improve the accuracy of a prediction model. Therefore, it is possible to obtain a better predicted value on the basis of a generated prediction model.

In the retrieval apparatus 300, the detection unit 409 determines an unstable operation of the semiconductor treatment apparatus 201 on the basis of an actually measured value of a processing result and a predetermined output threshold value, and the output unit 406 outputs a detection result in the detection unit 409. Consequently, it is possible to prompt a user to check whether or not a retrieval is continued.

Example 2

In Example 2, in addition to region division in the above Example 1, a demonstration test is performed on the basis of a prediction model, and an optimal solution satisfying a target is retrieved. Thus, in Example 2, a prediction model is repeatedly updated by applying a result of a demonstration test (processing result) to learning data until a target is satisfied, and the target is gradually updated toward a final target such that an optimal solution is retrieved. A semiconductor manufacturing system has the same configuration as that in the above Example 1, and only a difference from the above Example 1 will be described with respect to the process content.

Input Parameter Retrieval Examples

Figure 11:
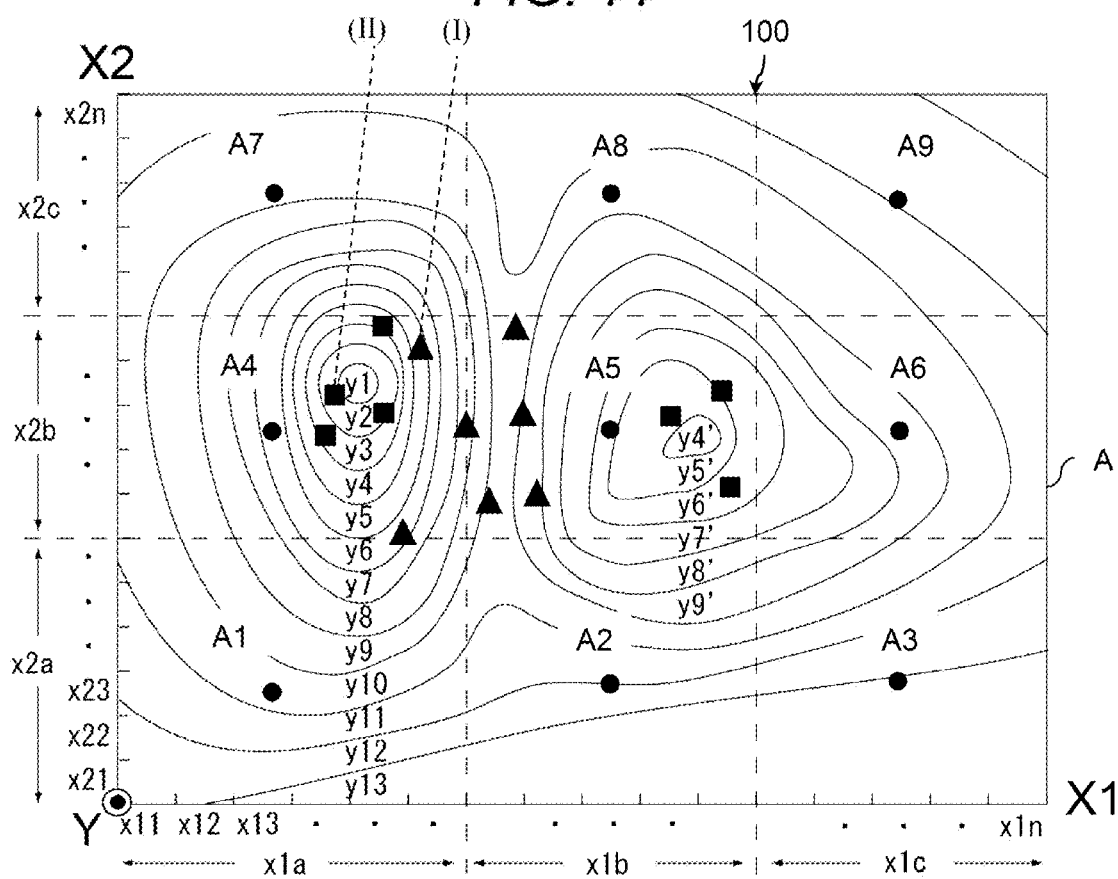
FIG. 11 illustrates Example 2 of the present invention, and is an explanatory diagram illustrating examples of retrieving input parameters.

FIG. 11 is an explanatory diagram illustrating input parameter retrieval examples. FIG. 11 illustrates examples of combinations of input and output data, that is, input data and output data for a semiconductor treatment apparatus when input data (the above-described value of an input parameter) causing output data (the above-described value of an output parameter) satisfying a target to be obtained is retrieved in the semiconductor treatment apparatus, in the same manner as FIG. 1 in the above Example 1.

In Example 2, a parameter of an initial data point (circular mark) in the figure is given to the retrieval apparatus 300 to generate a prediction model, and a prediction result using a prediction model is calculated as a first prediction point (triangular mark) in the figure. The retrieval apparatus 300 performs a demonstration test in the semiconductor treatment apparatus 201 by using the data of the first prediction point, and updates a prediction model by using a demonstration test result (processing result) as learning data.

The retrieval apparatus 300 updates the prediction model on the basis of the learning data to which the previous demonstration test result is applied, and calculates a prediction result using the prediction model as a second prediction point (rectangular mark) in the figure. The process is repeatedly perform until a demonstration test result (processing result) satisfies a target, and thus it is possible to retrieve an optimal solution.

Each functional unit illustrated in FIG. 4 in the above Example 1 has the following function in Example 2. The specifying unit 403 gives a target value which is input via the input unit 401 to the prediction model generated by the generation unit 402, so as to acquire a plurality of predicted values corresponding to the target value from the prediction model. The specifying unit 403 acquires an actually measured value of each output in a case where each predicted value is given to the semiconductor treatment apparatus 201 as a set value.

In a case where the target value is a value of an output parameter of the semiconductor treatment apparatus 201, the spec in unit 403 gives the value of the output parameter to the prediction model, so as to acquire a value of an input parameter as a predicted value corresponding to the target value from the prediction model.

Specifically, for example, in FIG. 11, in a case where the target value is a value y12 of the output parameter, predicted values corresponding to the target value y12 are values of the input parameters X1 and X2 specified by the contour line of the target value y12 in FIG. 11. Therefore, the specifying unit 403 specifies the input parameters X1 and X2 ((x11, x21), (x12,x21), (x13,x21), and the like) specified by the contour line of the target value y12 from the retrieval region A.

In the same manner as in the above Example 1, the first determination unit 404 determines whether or not a target value corresponding to a predicted value is closer to a target value than a reference value of a processing result which is input via the input unit 401.

In a case where the first determination unit 404 determines that the target value corresponding to the predicted value is closer to the target value than the reference value of a processing result, the setting unit 405 sets the predicted value and the target value corresponding to the predicted value to a reference value of a condition and a reference value of a processing result, respectively.

In the same manner as in the above Example 1, in a case where a predicted value satisfies an achievement condition for a target value, the output unit 406 outputs the predicted value satisfying the achievement condition.

In a case where the first determination unit 404 determines that the target value corresponding to the predicted value is not closer to the target value than the reference value of a processing result, the second determination unit 407 determines the predicted value and the target value corresponding to the predicted value as exclusion data (which will be described later in step A601 in FIG. 13). The exclusion data is a value of an input parameter which is not permitted to be given to the prediction model.

In this case, the setting unit 405 sets data obtained by excluding the exclusion data determined by the second determination unit 407 as learning data. Consequently, the generation unit 402 can use learning data in which the exclusion data is not present. Therefore, it is possible to improve a retrieval, speed for a value of an input parameter which is a solution.

In a case where the first determination unit 404 determines that the target value corresponding to the predicted value is not closer to the target value than the reference value of a processing result, the second determination unit 407 may determine a presence region of the predicted value as an exclusion region (which will be described later in step A602 in FIG. 13). The exclusion region is a region of a value of an input parameter which is not permitted to be output from the prediction model. Acquired data included in a peripheral region of the predicted value may be determined as exclusion data.

In this case, the setting unit 405 sets a residual region obtained by excluding the exclusion region determined by the second determination unit 407 from the retrieval regions, as a retrieval region. Consequently, a retrieval region can be narrowed by excluding a range of a predicted value which causes only a processing result not close to a target value to be obtained. Therefore, it is possible to improve a retrieval speed for a value of an input parameter which is a solution.

In the same manner as in the above Example 1, the division unit 408 divides a retrieval region into a plurality of regions.

As described above, in a case where the first determination unit 404 determines that the target value corresponding to the predicted value is not closer to the target value than the reference value of a processing result, the second determination unit 407 may determine the predicted value and the target value corresponding to the predicted value as exclusion data. In this case, as described in FIG. 9 in the above Example 1, the generation unit 402 may generate a prediction model on the basis of a residual actually measured value obtained by excluding the exclusion data from the actually measured value and a residual set value obtained by excluding a set value corresponding to the actually measured value from the set value. Consequently, it is possible to improve a retrieval speed for a value of an input parameter which is a solution.

As described above, in a case where the first determination unit 404 determines that the target value corresponding to the predicted value is not closer to the target value than the reference value of a processing result, the second, determination unit 407 may determine a peripheral region of the predicted value as an exclusion region. In this case, as described in FIG. 6 in the above Example 1, the generation unit 402 may generate a prediction model on the basis of a set value of a condition in a residual retrieval region obtained by excluding the exclusion region from the retrieval region, and an actually measured value of an output in a case where the set value is given to the semiconductor treatment apparatus 201. Consequently, it is possible to improve a retrieval speed for a value of an input parameter which is a solution.

In the same manner as in the above Example 1, the detection unit 409 detects an unstable operation of the semiconductor treatment apparatus 201 on the basis of an output from the semiconductor treatment apparatus 201 and a predetermined output threshold value.

Control Process Procedure Example in Semiconductor Treatment Apparatus 201

Figure 12:
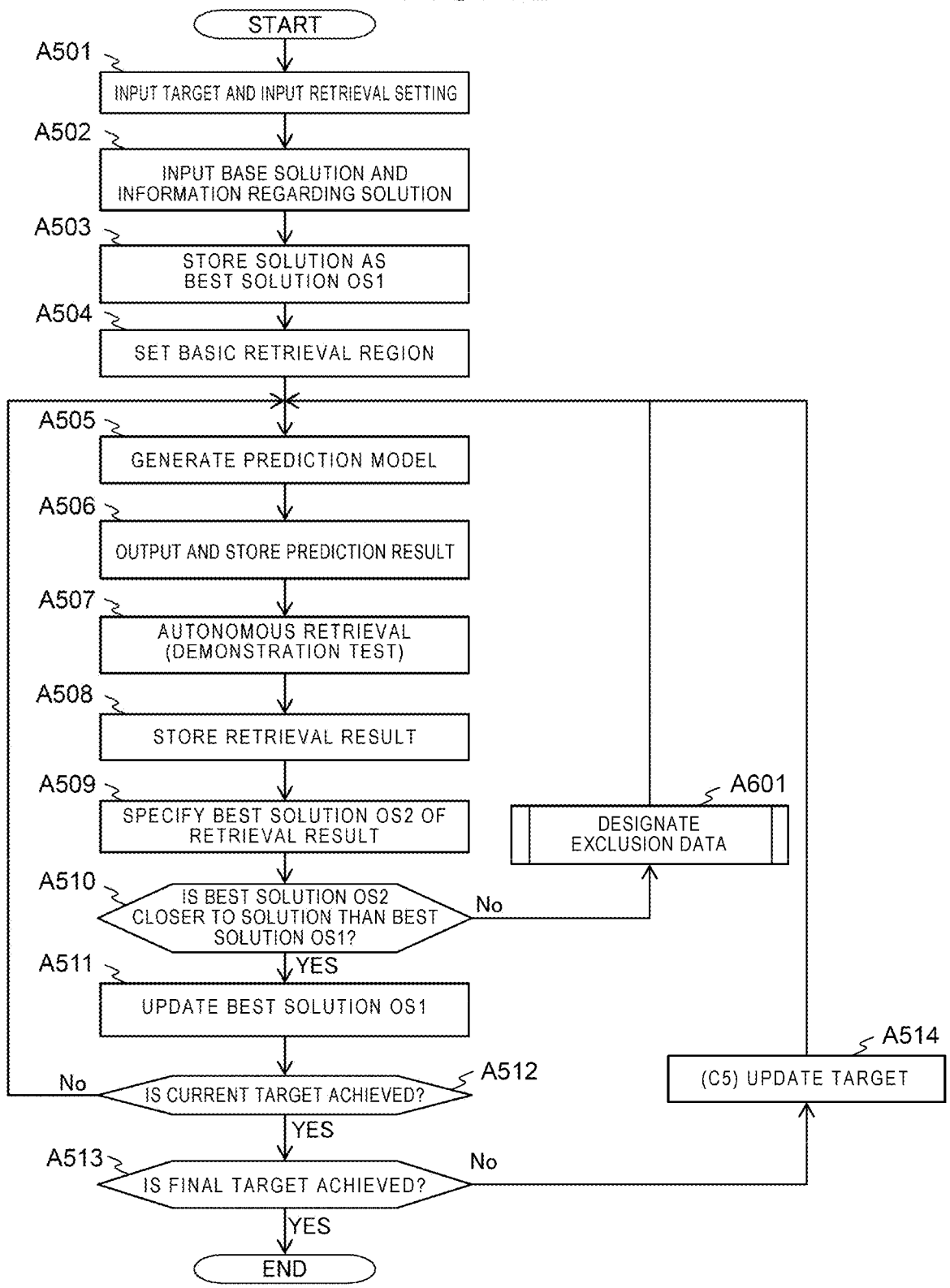
FIG. 12 illustrates Example 2 of the present invention, and is a flowchart illustrating a control process procedure example for a semiconductor treatment apparatus.

FIG. 12 is a flowchart illustrating a control process procedure example for the semiconductor treatment apparatus 201 in Example 2. In the figure, steps A501 to A504 are the same as steps S501 to S504 in FIG. 5 in the above Example 1. The retrieval apparatus 300 receives input of a target output value (a target value of an output parameter) from the semiconductor treatment apparatus 201 and retrieval setting (step A501).

Next, the retrieval apparatus 300 receives input of a solution which is a base and information regarding the solution (step A502).

Next, the retrieval apparatus 300 stores the best solution which is input in step A502 as the best solution OS1 (step A503). In a case where there is no solution, a system or a value indicating the fact of being farthest from a solution is set.

Next, the retrieval apparatus 300 sets a basic retrieval region as a retrieval region (step A504).

For example, in a case where the two input parameters X1 and X2 are selected as input parameters in FIG. 11, if a control range of the input parameter X1 is set to [x11,x1$n$], and a control range of the input parameter X2 is set to [x21,x2$n$], the region A of the entire range illustrated in FIG. 11 is a retrieval region.

The input and the set content for the target setting controller 261 in steps A501 to A504 are delivered to the autonomous retrieval system 262, and an automatic retrieval is performed according to procedures in steps A505 to A509 described next, or a semi-automatic retrieval is performed in a form in which an engineer gives an instruction for execution of a retrieval or whether or not a retrieval is continuously performed.

The retrieval apparatus 300 generates a prediction model for predicting a solution (input parameter) satisfying a target (target output) (step A505). Specifically, for example, the retrieval apparatus 300 generates, as the prediction model, a function indicating a relationship between input and output data for the semiconductor treatment apparatus 201 by using the data (for example, the initial data) stored in the database 205 in step A505. The input and output data is a set of a value of an input parameter (input data) given to the semiconductor treatment apparatus 201 and a value of an output parameter (output data) obtained from the semiconductor treatment apparatus 201. As a method of analyzing a relationship between input and output data, in the same manner as in the above the above Example 1, regression analysis which can cope with multi-input multi-output, such as regression using a neural network, support vector regression, or a Kernel method, may be used. Statistical analysis such as correlation analysis, principal, component analysis, or multiple regression analysis may be used.

In generation of the prediction model, for example, sensor data and monitor data for acquiring an indirectly measured value for a treatment result in the semiconductor treatment apparatus 201 are used as output data. There is a case where an acquisition frequency for output data is lower than a frequency defined in the retrieval setting, or acquisition time is longer than an acquisition time defined in the retrieval setting, and the number of pieces of output data which can be acquired through a retrieval is smaller than the number of pieces of output data defined in the retrieval setting. In this case, the sensor data and the monitor data may be acquired such that the number of pieces of data is larger than the number of pieces of acquired output data. Consequently, it is possible to analyze a relationship of sensor data and monitor data for the output data, or a relationship of input data for the sensor data and the monitor data. It is possible to obtain a relationship of the input data for the output data by using both of the analysis results.

In generation of the prediction model, a part of the treatment object may be taken out as a fragment, a measurement result (processing result) may be acquired by carrying the fragment to the monitor system 203, and data stored in the database 205 as a result thereof may be used as an output result. In this case, in a case where the time required for fragmentation of a treatment object and acquisition of data is random or long, an upper limit of the time to acquire output data (a value of an output parameter) from the semiconductor treatment apparatus 201 may be set to a sufficient long time. Alternatively, a process can be performed by separately transmitting an acquisition finish signal to the retrieval apparatus 300 without setting an upper limit of the time to acquire output data.

Next, the retrieval apparatus 300 predicts a parameter for obtaining a target solution or a processing result close to the target solution by using the generated prediction model, and stores the parameter as a prediction, result (step A506).

For example, in a case where the two input parameters X1 and X2 are selected as input parameters in FIG. 11, a description will be made of output of a prediction result by using a case where the initial data (A1 to A9) in FIG. 11 is given as data for creating a prediction model. A treatment in this case is to retrieve the input parameters X1 and X2 causing the output parameter y to be largest.

The retrieval apparatus 300 generates a regression model for obtaining an input-output relationship as a prediction model by using the initial data. As described above, if a control range of the input parameter X1 is divided into [x11,x1n] and a control range of the input parameter X2 is divided into [x21,x2n], the number of regions of the graph 100 is $n^2$. In a case where each of the input parameters X1 and X2 is divided into sixteen regions, the number of regions is $n^2=256$. In FIG. 11, the number of pieces of initial data is nine, and thus data of about 1.5% of all of the regions is acquired.

Therefore, since an accurate distribution of Y shown in the graph 100 cannot be known, it is considerably difficult to retrieve a combination (x15,x210) of the input parameters X1 and X2, obtained from a prediction model or a prediction result, causing the best solution y1 to be obtained, through one prediction. As described above, in a case where an input parameter space is vectorized and is widened, it is more difficult to retrieve the best solution.

In order to retrieve the best solution through one prediction, it is necessary to acquires and analyze data covering all regions in the retrieval space, but, as described above, as the number of parameters increases, combinations of the parameters is huge, and thus the time for retrieval of all regions is enormous, so that the retrieval is hardly performed.

In order to avoid this problem and also to retrieve a solution with high efficiency, prediction and verification may be repeatedly performed by performing (a) acquisition of model creation data, (b) creation of a prediction model, (c) acquisition of a prediction result, and (d) a demonstration test of the prediction result, and further (a') by adding demonstration test data to the model creation data. In other words, (a) to (d) may be performed by using the initial data in FIG. 11, first prediction data (=demonstration data) in FIG. 11 may be added to the database 205 as model creation data, (b), (c), and (d) may be repeatedly performed, and farther (a') to (d) may be continuously repeatedly performed.

(a), (b), (c), and (d) respectively correspond to steps A502, A505, A506 and A507 in FIG. 12. (a') corresponds to step A508.

Specifically, for example, the retrieval apparatus 300 acquires input and output data for the semiconductor treatment apparatus 201 in each retrieval condition through autonomous retrieval as a demonstration test result, that is, a retrieval result, by using a prediction condition as the retrieval condition.

Specifically, the for example, the retrieval apparatus 300 selects a value of an input parameter satisfying the retrieval conditions for each division region, and gives the selected value of the input parameter to the semiconductor treatment apparatus 201. The retrieval apparatus 300 acquires output data (a value of an output parameter) from the semiconductor treatment apparatus 201. A combination of the value of the input parameter and the value of the output parameter corresponding to the value is a retrieval result.

In this case, the unstable operation detection system 263 detects a case where the semiconductor treatment apparatus 201 can continuously perform treatment, but treatment in the semiconductor treatment apparatus 201 is unstable, during execution of the autonomous retrieval. In a case where an unstable operation is detected, the autonomous retrieval is continuously performed by the target setting controller 261 by executing a sequence for recovering the semiconductor treatment apparatus 201 to a normal operation state after treatment completion, or by immediately stopping treatment and executing a sequence for recovering the semiconductor treatment, apparatus 201 to a normal operation state.

The retrieval apparatus 300 stores the retrieval result in the database 205 (step A508). Specifically, for example, the retrieval apparatus 300 stores input and output data which is a set of a value of an input parameter used for the autonomous retrieval (step A507) and a value of an output parameter of the semiconductor treatment apparatus 201 acquired by using the value of the input parameter, in the database 205 as a retrieval result.

If the number of points predicted at a time in step A506 is one or more, the above (a) or the above (a') to (d) can be repeatedly performed. However, in a case where the number of prediction points is one, local solutions predicted from the model are passed one by one before reaching a final optimal solution, and, as the number of local solutions increases, the retrieval prolongs.

In a case where a total time for prediction model creation and output of a prediction result is long relative to the time required for data acquisition of one point, if the number of prediction points is one, the semiconductor treatment apparatus 201 is in a standby state until a prediction result is output. The standby time occurs when the above (a') to (d) are repeatedly performed, and thus a retrieval prolongs.

Therefore, if a plurality of prediction data points are obtained, a demonstration test can be performed during prediction model creation and outputting of a prediction result, and thus it is possible to make a retrieval efficient.

If a plurality of prediction data points are used, the best solution of when a wider retrieval region is taken into consideration can be obtained, and thus it is possible to perform a retrieval with high efficiency while avoiding a local solution having a low probability of being the final best solution.

Since the data acquired in steps A507 and A508 is new data which is not acquired hitherto, this data is provided to an engineer, and thus it is possible to support analysis performed by the engineer and understanding of a result.

Thus, in a case where there is al update speed of data requested by the engineer, that is, a time width for which the data is to be updated, the retrieval time in step A507 is preferably set in accordance with the time width. The time to update data, requested by the engineer, is, for example, 24 hours, 8 hours, one hour, or 30 minutes.

The number of prediction results to be output in step A506, that is, the number of pieces of prediction data can be increased in accordance with the data update request time from the engineer. For example, in a case where the engineer requests data to be updated every hour, and ten minutes is required for one retrieval, the number of pieces of prediction data is six in accordance therewith.

Consequently, it is possible to perform the retrieval and the analysis in the engineer in FIG. 12 with high efficiency.

In the prediction model creation in step A505, a prediction model is created which depends on an analysis method used to create the prediction model, for example, a regression method using a neural network, support vector regression, or a Kernel method. In various analysis models, there is limitations for each model with respect to the types of input, and output data, distribution characteristics of the data, and the number of pieces of data, and thus prediction accuracy varies. Thus, in a case where a single prediction engine is used, the prediction engine may not be suitable for acquired input and output data, and thus a retrieval time prolongs. Therefore, it is possible to increase a possibility that a better prediction result can be output while coping with a variety of input and output data by obtaining a plurality of pieces of prediction data by using a plurality of types of prediction models (prediction engines).

In a case where demonstration test data corresponding to data which is output as a prediction result has been acquired, a demonstration test of the data is not performed, and thus a retrieval can be made efficient.

Next, the best solution OS2 is specified from the acquired data, and the specified best solution OS2 is stored in the database 205 (step A509).

The processes in steps A505 to A509 have two methods. The first method is a method (first estimation method) of giving the target value of the output parameter given in step A501 to the prediction model.

In the first estimation method, specifically, for example, the retrieval apparatus 300 assigns the target value of the output parameter given in step A501 to the prediction model obtained in step A505, so as to estimate input data (a value of the input parameter) which is a solution satisfying the target value of the output parameter.

The retrieval apparatus 300 performs a demonstration test of the predicted input data in step A507, and stores output data acquired as a result thereof in the database 205 in step A508.

In step A509, the retrieval apparatus 300 specifies an input parameter causing the same output data as the target value to be acquired, an input parameter causing output data having a difference or deviation between the output data and the target value smaller than the allowable value (the allowable value given in step S501) to be acquired, or an input parameter causing output data closest to the target value to be acquired, by using the acquired output data, and determines an input parameter closest to the target value as the best solution OS2 among the input parameters.

In the first estimation method, a prediction model is used in which an input, parameter causing a target value of an output parameter to be obtained can be uniquely obtained. In this case, a prediction result is one piece of data.

In order to increase the number of prediction points, it is preferable to give, to the prediction model, an upper limit value and a lower limit value of a target value of the output parameter in an allowable range, an intermediate value between the target value and the upper limit value, a value obtained by equally dividing between the target value and the upper limit value, an intermediate value between the target value and the lower limit value, and a value obtained by equally dividing between the target value and the lower limit value. As described above, it is possible to increase the number of prediction points by using a plurality of prediction models.

In a case of the above example, in a case where a prediction model is created by using the initial data in FIG. 11, y1 is given to the prediction model as a target value such that prediction is performed, and output data acquired in a demonstration test is the same as in FIG. 11 indicated by the prediction model, if (x16,x211) (data (I) in FIG. 11) are acquired as output data of a first prediction point, input parameters (x16,x211) causing y5 which is the best at output data acquired until then to be obtained are the best solutions OS2.

The other method of the processes in steps A505 to A509 is a method (second estimation method) which is applicable in a case where an input parameter serving as a solution satisfying the target value of the output parameter is not directly obtained by assigning the target value of the output parameter given in step A501 to the prediction model.

The second estimation method is a method in which a plurality of sets of input parameters are given to the prediction model with input parameters, given to the prediction model at a time as a set, so that an estimated output parameter is computed, and a set of input parameters causing a processing result closest to a target output to be obtained is acquired. After a prediction model is created, for example, as illustrated in FIG. 11, the retrieval region in the graph 100 may be divided into A1 to A9, one or more sets of input parameters included in each division region are created with respect to each division region, and the sets of input parameters are given to the prediction model, so that an output parameter at this time can be computed. Regarding a method of obtaining a representative estimated output of each division region, values of central coordinates in the division region may be used as a set of input parameters.

In a case where a large number of sets of input parameters are given to the prediction model, and an estimated output is computed, if a computation time considerably increases, as described by using the above Equations (1.1) to (1.3), a central condition of an input parameter given to the prediction model is determined, and an input parameter which can be changed from the central condition is restricted, so that a computation time can be restricted. It is possible to reduce a computation time by restricting the number of input parameters which can be changed from the central condition at a time. Consequently, an input parameter causing a result close to a target output to be obtained can be obtained while reducing the number of sets of input parameters given to the prediction model. A past retrieval result or knowledge of an engineer may be used to predict the central condition. Alternatively, central coordinates of the entire retrieval region may be used as a central condition.

In the second estimation method, specifically, the retrieval apparatus 300 assigns values of a set of input parameters to the prediction model obtained in step A506, so as to acquire a value of, an output parameter which is a predicted value. For example, in a case where the prediction, model is created by using the initial data in FIG. 11, and (x11,x21), (x11,x22), (x11,x23), (x12,x21), (x12,x22), (x12,x23), (x13,x21), (x13, x22), (x13,x23), (x1n,x21), (x1n,x22), and (x1n,x23) are given to the prediction model as values of input parameters, an estimated output parameter corresponding to each input parameter can be obtained.

Among the estimated output parameters, an input parameter causing output data having a difference or deviation between estimated output data and the target value smaller than the allowable value (the allowable value given in step S501) to be acquired, or an input parameter causing estimated output data closest to the target value to be acquired is specified, and the estimated output data and the input parameter are stored as prediction results.

The first prediction point in FIG. 11 is an example of a prediction result in a case where a prediction model is created by using the initial data, and y6 or more is an allowable value with y1 as a target value. In this example, since prediction is performed on the basis of a very small number of pieces of initial data, each point predicted to have a value of y6 or more is different from an actual output value illustrated in FIG. 11.

Next, actual data of the first prediction point is acquired. The prediction model is updated by using the initial data and the output data of the first prediction point. An example of a prediction result using the updated prediction model is a second prediction point in FIG. 11. The best solutions included in output data as a first prediction result are (x16, x211) causing the output y5 to be obtained. In contrast, demonstration test data (output data) of the first prediction and prediction point is added to the initial data, and, thus, in demonstration test data of the second prediction and prediction point, (x14, x210) (data (II) in FIG. 11) which are output results closer to the target y1 are obtained.

The above-described processes are repeatedly performed, and thus an input parameter satisfying the output y1 which is a target value can be obtained. A retrieval can be performed with high efficiency by restricting the number of pieces of data which is necessary until a target result is obtained.

In step A509, for example, the retrieval apparatus 300 determines, as the best solution OS2, a value of an input parameter causing a value of an output parameter closest to the target value of the output parameter to be obtained. Of the first estimation method and the second estimation method, an applied method is set in advance.

The retrieval apparatus 300 determines whether or not a value of an output parameter corresponding to the best solution OS2 is a solution which is closer to the target than a value of an output parameter corresponding to the best solution OS1 (step A510). In a case where a value of an output parameter corresponding to the best solution OS2 is a solution which is closer to the target than a value of an output parameter corresponding to the best solution OS1 (step A510: Yes), the flow proceeds to step A511, and if otherwise (step A510: No), the flow proceeds to step A601 (FIG. 13).

In a case of Yes in step A510, the retrieval apparatus 300 sets the best solution OS2 as the best solution OS1 so as to update the best solution OS1 (step A511).

Next, the retrieval apparatus 300 determines whether or not the current target is achieved (step A512). In a case where the current target is achieved (step A512: Yes), the retrieval apparatus 300 proceeds to step A513 and determines whether or not a final target is achieved. On the other hand, in a case where the current target is not achieved (step A512: No), the flow proceeds to step A505.

Next, the retrieval apparatus 300 determines whether or not the final target is achieved (step A513). In a case where the final target is achieved (step A513: Yes), the retrieval apparatus 300 finishes the control process. On the other hand, in a case where the final target is not achieved (step A513: No), the flow proceeds to step A514 and updates the target.

In step A512, specifically, for example, in a case where an output parameter corresponding to the updated best solution OS1 is the same as the current target value or a difference from the current target value is within an allowable range, the retrieval apparatus 300 determines that the current target is achieved (step A512: Yes). Even if a case where an output parameter corresponding to the updated best solution OS1 is not the same as the current target value or a difference from the current target value is not within an allowable range, in a case where the retrieval time set in step A501 has elapsed, the retrieval apparatus 300 determines that the target is achieved (step A512: Yes). In a case where an output parameter corresponding to the updated best solution OS1 is not the same as the current target value or a difference from the current target value is not within an allowable range, and the retrieval time set in step A501 has not elapsed, the retrieval apparatus 300 determines that the target is not achieved (step A512: No).

In step A513, specifically, for example, in a case where an output parameter corresponding to the updated best solution OS1 is the same as the final target value or a difference from the final target value is within, an allowable range, the retrieval apparatus 300 determines that the final target is achieved (step A513: Yes). Even if a case where an output parameter corresponding to the updated best solution OS1 is not the same as the final target value or a difference from the final target value is not within an allowable range, in a case where the retrieval time set in step A501 has elapsed, the retrieval apparatus 300 determines that the target is achieved (step A513: Yes). In a case where an output parameter corresponding to the updated best solution OS1 is not the same as the final target value or a difference from the final target value is not within an allowable range, and the retrieval time set in step A501 has not elapsed, the retrieval apparatus 300 determines that the target, is not achieved (step A513: No).

In step A514, the target value, and the allowable range of a difference or deviation between a retrieval result and the target value are updated. In the processes from A505 to A512, in a case where a final target is given from the beginning, or in a case where a very small value is given as, an allowable value of a difference or deviation between a prediction result and a target value, the difficulty of the best solution OS2 increases, and thus there is a possibility that a solution cannot be found. In order to prevent this, a target separate from a final target may be given as the current target in an initial stage of a retrieval. In a case where the current target is achieved, and the final target is not achieved (step A513: No), in step A514, a target value is made close to the final target value stepwise, and thus it is possible to increase a possibility that a solution causing the final target to be achieved can be found.

In a case where a great value is given as an allowable value of a difference or deviation between a prediction result and a target value regarding the current target, the current target is achieved, and the final target is not achieved (step A513: No), a target value is made close to the final target value stepwise, and thus it is possible to increase a possibility that a solution causing the final target to be achieved can be found.

As a stepwise update method from an initial target to a final target, a plurality of target values between the initial target and the final target may be prepared, the initial target may be given as the initial current target, and a target value close to the final target may be updated as the current target value whenever the current target is achieved. Alternatively, the initial target may be given as the initial current target, and a plurality of target values prepared to gradually come close to the final target at a predetermined ratio may be used.

A description will be made of a case where, regarding the data, the initial data has been acquired, but, in a case where there is no initial data, the initial data may be acquired by using a region division method in the above Example 1. Alternatively, a condition for acquisition of initial data may be determined by using a test plan method, and thus the initial data may be acquired. The region division method is the process method in steps S501 to S507 in FIG. 5 in the above Example 1, including respective steps of setting a basic retrieval region, dividing the retrieval region, and performing autonomous retrieval in each division region.

Figure 13:
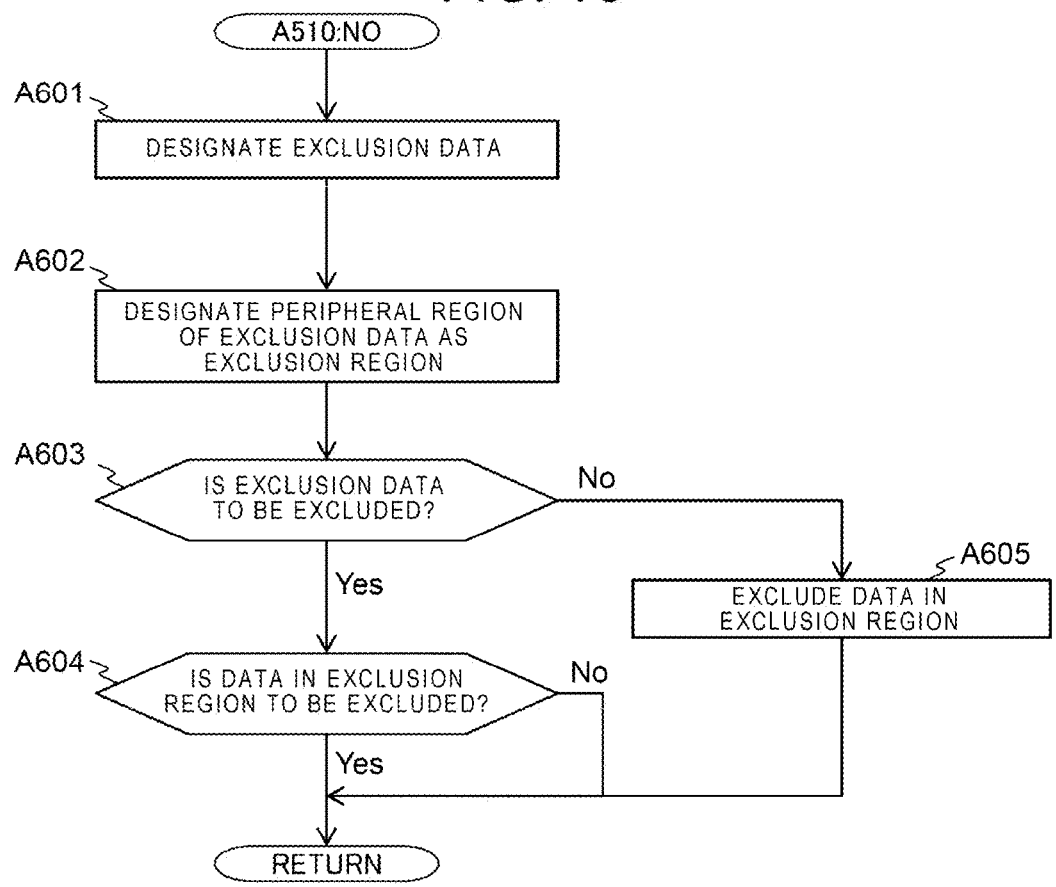
FIG. 13 illustrates Example 2 of the present invention, and is a flowchart illustrating a control process procedure example for the semiconductor treatment apparatus.

FIG. 13 is a flowchart illustrating a control process procedure example for the semiconductor treatment apparatus 201. In a case where a determination result in step A510 in FIG. 12 is No, the retrieval apparatus 300 proceeds to step A601 in FIG. 13. In step A601, with respect to the data obtained until step A505, the best solution OS1 or data obtained until the best solution OS1 is updated is determined as exclusion data.

The update of the best solution OS1 is that, specifically, for example, the best solution OS1 at a time point where data up to the first prediction data point in FIG. 11 is obtained is set as the new best solution OS1 due to acquisition of data of the second prediction data point. In a case of this example, data obtained until the best solution OS1 is updated is data of the second prediction data point, and is determined as exclusion data in step A601.

Hereinafter, a description will be made of a case where the best solution OS1 is an object of exclusion data. In step A601, specifically, for example, the retrieval apparatus 300 determines input data (a value of an input parameter) and output data (output parameter) of the best solution OS1 as exclusion data. The exclusion data is data which may possibly be excluded in the subsequent process.

Next, the retrieval apparatus 300 determines a peripheral region of the exclusion data determined in step A601 as an exclusion region step A602). The exclusion region is a region which may possibly be excluded in the subsequent process.

Hereinafter, a description will be made of a case where the best solution OS1 is an object of exclusion data as described in step A601.

In a method of determining a peripheral region of exclusion data, a value changed at a predetermined ratio from each parameter of the best solution OS1 may be used. In other words, for example, if a change ratio is 1%, each parameter of the best solution OS1 is changed at ±1%, and, if a change ratio is ±5%, each parameter of the best solution OS1 is changed at ±5%. This ratio may be set for each parameter of the best solution OS1. In a method of setting a ratio, a ratio for a range of a value which can be taken by each parameter may be used. In other words, in a case where a range which can be taken by a parameter A of the best solution OS1 is 0 to 200, a change ratio is 3%, and a value of the parameter A of the best solution OS1 is 150, an exclusion region of the parameter A of the best solution OS1 is 150±6.

After step A602, the retrieval apparatus 300 determines whether or not the exclusion data determined in step A601 is to be excluded (step A603). In a case where the exclusion data is excluded (step A603: Yes), the flow proceeds to step A604, and, in a case where the exclusion data is not excluded (step A603: No), the flow proceeds to step A605.

In step A603, specifically, for example, the retrieval apparatus 300 determines whether or not the division region is to be divided depending on whether or not a division instruction is input from a user. The retrieval apparatus 300 may force the exclusion data to be excluded (step A603: Yes).

After step A603, the retrieval apparatus 300 determines whether or not the data in the exclusion region determined in step A602 is to be excluded (step A604). A case where the data is excluded (step A604: Yes and a case where the data is not excluded (step A604: No) are determined, and the flow proceeds to step A505.

In step A604, specifically for example, the retrieval apparatus 300 determines whether or not the data in the exclusion region is to be excluded depending on whether or not a division instruction is input from the user. The retrieval apparatus 300 may force the data in the exclusion region to be excluded (step A604: Yes).

In a case where analysis is performed without excluding the data in the exclusion region in step A603 (step A603: No), the retrieval apparatus 300 proceeds to step A605, excludes the data in the exclusion region in step A605, and then proceeds to step A505.

In step A601, exclusion data and exclusion region designation methods using the region division method in FIGS. 6, 7 and 8 in the above Example 1 may be used. With respect to "A", "B", "C", and "D" in the flowcharts of FIGS. 5 to 8 in the above Example 1, "A" corresponds to step A601: No, "B" and "C" respectively correspond to step A604, and step A605 to step A505, and "D" corresponds to step A511 to step A512.

In the present control process, in a case where the scales of analysis, storing, transmission, and the like of data are increased, and thus execution times thereof are longer than the time to retrieve one condition, a retrieval can be continuously performed in parallel to the execution. In this case, one or more of the number of input parameters changed in a retrieval condition, the number of input parameters changed simultaneously, and the division number of a retrieval region are increased. Consequently, the number of retrieval conditions are increased, and a retrieval is performed by using the conditions. Thus, it is possible to increase the number of retrieval results by using the time to perform analysis and the like. Particularly, there is a case where the time required for analysis of data is several minutes to several hours, and a retrieval is continuously performed during the analysis such that a retrieval speed can be improved.

Application Example 1 of Control Process for Semiconductor Treatment Apparatus 201

Next, a description will be made of an application example of a control process for correcting an apparatus difference in the semiconductor treatment apparatus 201 in maintenance of the semiconductor treatment apparatus 201 before mass production of semiconductor devices. Herein, as an example of, describing procedures of apparatus difference suppression, the semiconductor treatment apparatus 201 is an etching apparatus performing a discharge process.

Here, an input parameter of when the discharge process is performed will be referred to as a recipe. In the etching apparatus performing the discharge process, an output which is a correction object may be a treatment result or a characteristic of discharge used for treatment. A correction method is a method of correcting another etching apparatus such that the same output as in a reference etching apparatus is obtained, or a method of correcting a plurality of etching apparatuses such that outputs therefrom are uniform.

In an apparatus difference suppression method, the retrieval apparatus 300 starts to acquire discharge data after maintenance in order to correct an apparatus difference in the same manner as in FIG. 9 in the above Example 1.

First, the retrieval apparatus 300 performs reference recipe discharge by using a recipe for performing a fundamental discharge process, and acquires input and output data at this time. The retrieval apparatus 300 performs discharge by using a recipe used for mass production, and acquires output data (a value of an output parameter) at this time (step S901 in FIG. 9). The process in step S901 corresponds to the processes in steps A501 to A504.

In the reference recipe discharge, in the same manner as in FIG. 9 in the above Example 1, a recipe may be set by using the region division method, and input and output data at this time may be acquired. Alternatively, a recipe may be set by using the test plan method, and input and output data at this time may be acquired.

Next, the retrieval apparatus 300 predicts apparatus difference correction recipe candidates (step S902 in FIG. 9). The process in step S902 corresponds to the processes in steps A505 and A506 of Example 2.

The retrieval apparatus 300 performs apparatus difference correction which is also used as a demonstration test by using the apparatus difference correction recipes predicted in step S902 (step S903 in FIG. 9). The process in step S903 corresponds to the processes in steps A507 to A511 and FIG. 13. In a case where a correction target is not achieved (step S904: No), the flow returns to step S902, and, in a case where the correction target is achieved (step S904: Yes), the process is finished. The process in step S904 corresponds to the processes in steps A512 and A513.

Retrievals may be performed in parallel by using a plurality of etching apparatuses performing the same mass production process, and thus a retrieval speed is improved. In this case, it is possible to increase a possibility that a solution satisfying a target can be retrieved by using a plurality of etching apparatuses in which an apparatus difference is corrected according to the procedures in FIG. 9, it is possible to perform correction by developing the retrieved solution in the plurality of apparatuses.

As mentioned above, the retrieval apparatus 300 performs a retrieval method after maintenance of the semiconductor treatment apparatus 201, and thus it is possible to cause a value of an output parameter of the semiconductor treatment apparatus 201 to be close to a reference value of an output parameter (automatic apparatus difference correction function).

Application Example 2 of Control Process for Semiconductor Treatment Apparatus 201

Next, in a mass production process of semiconductor devices, a control process for correcting a temporal change is as illustrated in FIG. 10 in the above Example 1.

In Example 2, in the same muter as in FIG. 9 in the above Example 1, as an example of describing procedures of correcting a temporal change, the semiconductor treatment apparatus 201 is an etching apparatus performing a discharge process. In data acquisition before mass production, in order to correct a technique during mass production, first, the retrieval apparatus 300 gives a reference recipe for performing a fundamental discharge process to the etching apparatus to perform reference recipe discharge, and acquires output data (a value of an output parameter) at this time (step S1011). The process in step S1011 corresponds to the processes in steps A501 to A504.

In the reference recipe discharge, a recipe may be set by using the region division method in the above Example 1, and input and output data at this time may be acquired. Alternatively, a recipe may be set by using the test plan method, and input and output data at this time may be acquired.

Next, the retrieval apparatus 300 retrieves an apparatus difference correction candidate recipe (step S1012). In step S1012, there is the use of output data, or sensor data and monitor data causing a temporal change of a correction object to be predicted on the basis of analysis results of input and output data in the past mass production. The retrieval apparatus 300 retrieves an apparatus difference correction candidate recipe for applying the data causing such a temporal change to be expected to a value after the temporal change in the etching apparatus before starting mass production. The process in step S1012 corresponds to the processes in steps A505 and A506.

The retrieval apparatus 300 performs apparatus difference correction which is also used as a demonstration test by using the apparatus difference correction recipes predicted in step S1012 (step S1013).

In step S1013, the retrieval apparatus 300 compares a fundamental mass production recipe used in a state in which a temporal change does not occur with the apparatus difference correction candidate recipe retrieved in step S1012, so as to clarify an input parameter changed by the apparatus difference correction candidate recipe. Consequently, it is possible to generate a function indicating a relationship between an input parameter and an output parameter of a correction object in the stage of mass production, and also to generate a recipe which is a correction candidate on the basis of the relationship. The process in step S1013 corresponds to the processes in steps A507 to A511 and FIG. 13. Subsequently, a mass production process is started.

After step S1013, if the mass production of semiconductor devices is started, a wafer is introduced into a treatment chamber (step S1021), and the etching apparatus etches the wafer (step S1022). The etching (step S1022) is formed of one step or a plurality of, steps. In a case where the etching (step S1022) is formed of a plurality of steps, etching in each step is performed while changing a discharge condition. After the etching (step S1022) is completed, the wafer is carried out of the treatment chamber (step S1023). Plasma cleaning is performed to remove a reaction product generated during the etching and deposited on a treatment chamber surface (step S1024). In a case where there is, the next wafer (step S1025: Yes), the flow returns to step S1021, and, in a case where there is no next wafer (step S1025: No), the flow proceeds to discharge data acquisition after mass production.

Input and output data for the etching apparatus during mass production are stored in the database 205, and the retrieval apparatus 300 continuously analyzes the input and output data in parallel in real time. Consequently, it is possible to continuously estimate output data or sensor data and monitor data causing a temporal change of a correction, object to be predicted during mass production. The retrieval apparatus 300 collects input and output data for a plurality of etching apparatuses performing the same mass production process, so as to be able to increase the number of pieces of data.

In a case where discharge data is acquired after mass production or after designated time elapses from the starting of the mass production, the retrieval apparatus 300 predicts candidates of temporal change correction recipes (step S1031). Specifically, for example, the retrieval apparatus 300 predicts the candidates of technique correction recipes by using the data acquired in steps S1011 and S1012, an analyzed relationship between input and output data, the correction candidate recipe as inputs in step A502. The process in step S1031 corresponds to the processes in steps A505 and A506.

The retrieval apparatus 300 performs correction which is also used as a demonstration test, that is, performs verification of a correction result by using the temporal change correction recipes predicted in step S1031 (step S1032). The process in step S1032 corresponds to the processes in steps A507 to A511 and FIG. 13.

Before execution of steps S1031 and S1032, the retrieval apparatus 300 may estimate output data or sensor data and monitor data causing a temporal change of a correction object to be predicted by, using output data acquired during mass production of semiconductor devices, and may execute step S1012. Consequently, it is possible to generate a function indicating a relationship between an input parameter and an output parameter of a correction object, and also to generate a recipe which is a correction candidate on the basis of the relationship. The retrieval apparatus 300 can execute steps S1031 and S1032 by using the result in step S502.

As inputs in step A502 in the process, there may be the use of a recipe obtained by changing an input parameter which is frequently used for correction by using knowledge of an engineer, and output data and an analysis result thereof of when discharge is performed by using the recipe.

In a case where a correction target is not achieved (step S1033: No), the flow returns to step S1031, and, in a case where the correction target is achieved (step S1033: Yes), the process is finished. The process in step S1033 corresponds to the process in steps A512 and A513. In a case where the retrieval illustrated in FIG. 10 is performed, retrievals are performed in parallel by using a plurality of etching apparatuses after mass production having performed the same mass production process, and thus it is possible to improve a retrieval speed. A retrieved solution (input parameter) can be developed to a plurality of etching apparatuses performing the same mass production process, and correction can be performed.

As mentioned above, the retrieval apparatus 300 performs a retrieval method after mass production of semiconductors, and thus it is possible to correct a temporal change in a value of an output parameter of the semiconductor treatment apparatus 201 during mass production (automatic temporal change correction function).

Application Example 3 of Control Process for Semiconductor Treatment Apparatus 201

Next, in treatment of semiconductor devices, a description will be made of an application example of a control process for optimizing a processed shape.

Figure 14:
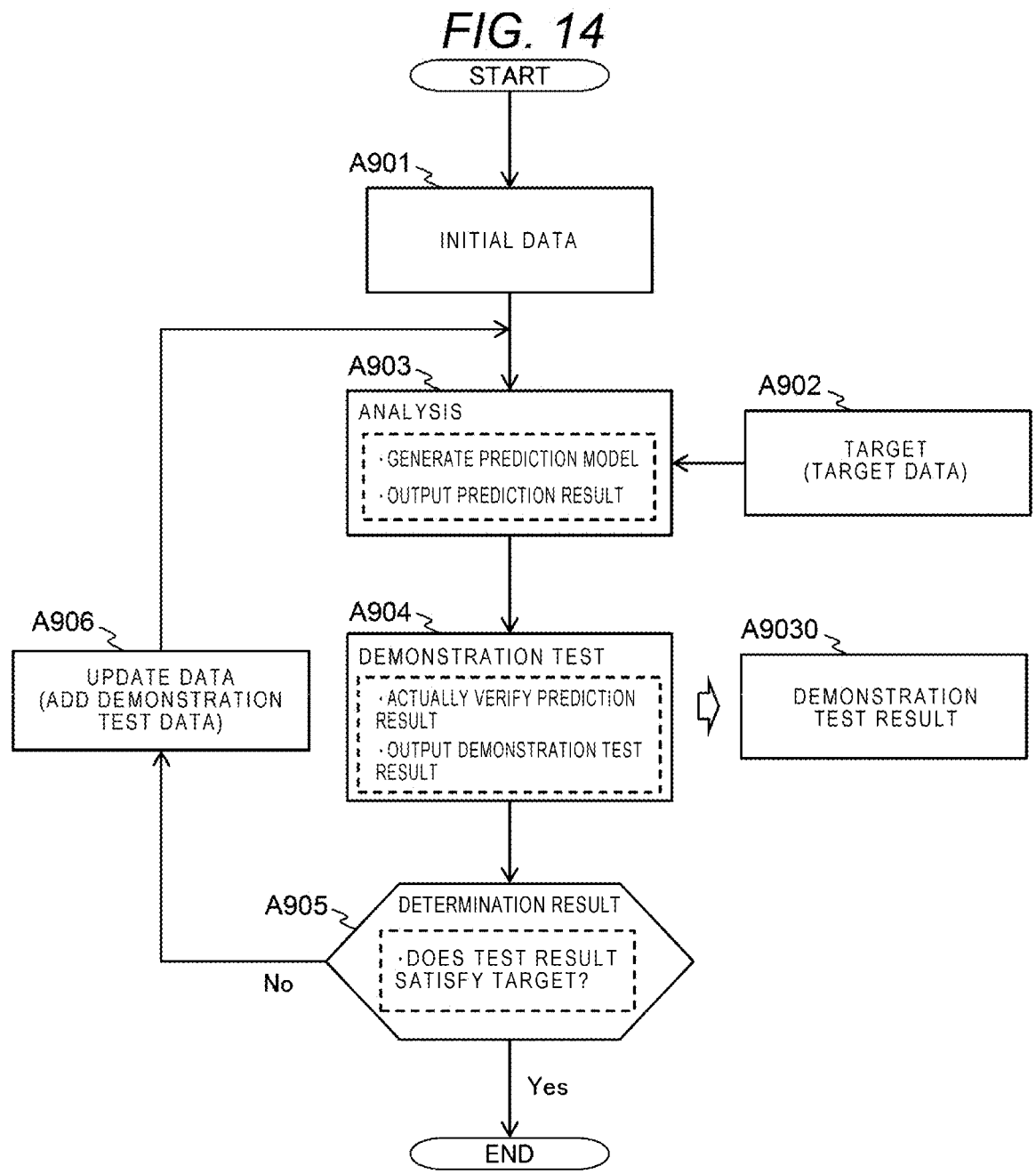
FIG. 14 illustrates Example 2 of the present invention, and is a flowchart illustrating a processed shape optimization method.

FIG. 14 is a flowchart illustrating a summary of a processed shape optimization method. In FIG. 14, in the same manner as in FIG. 10, as an example of describing procedures of correcting a temporal change, as an example, the semiconductor treatment apparatus 201 is an etching apparatus which uses discharge for treatment.

As examples of input and output data in processed shape optimization, a description will be made assuming that input data for the apparatus is a recipe, and output data is processed shape data.

First, the retrieval apparatus 300 performs etching, by using a fundamental recipe for etching a processing object film, and acquires input and output data at this time as initial data (step A901). The process in step A901 corresponds to the processes in steps A501 to A504 illustrated in FIG. 12.

In the initial data acquisition, a recipe may be set by using the region division method in the same manner as in the above Example 1, and input and output data of when etching is performed by using the recipe may be acquired. Alternatively, a recipe may be set by using the test plan method, and input and output data of when etching is performed by using the recipe may be acquired.

Next, a target processed shape is given to the retrieval apparatus 300 (step A902). The retrieval apparatus 300 predicts candidates of processed shape optimization recipes (step A903).

The process in step A902 corresponds to the process in step A502, and the process in step A903 corresponds to the processes in steps A505 and A506.

The retrieval apparatus 300 performs a demonstration test by using the processed shape optimization recipes predicted in step A903, and outputs a demonstration test result A9030 (step A904). Then, it is determined whether or not the demonstration test result satisfies a target value (step A905).

The processes in step A904 and A905 correspond to the processes in steps A507 to A511 and FIG. 13. In a case where the target is not achieved (step A905: No), the data (the demonstration test result A9030) acquired through the demonstration test is added to the database such that the data is updated (step A906), and the flow, returns to step A903.

In a case where the correction target is achieved (step A905: Yes), the process is finished. The process in step A905 corresponds to the process in steps A512 and A513.

Figure 15:
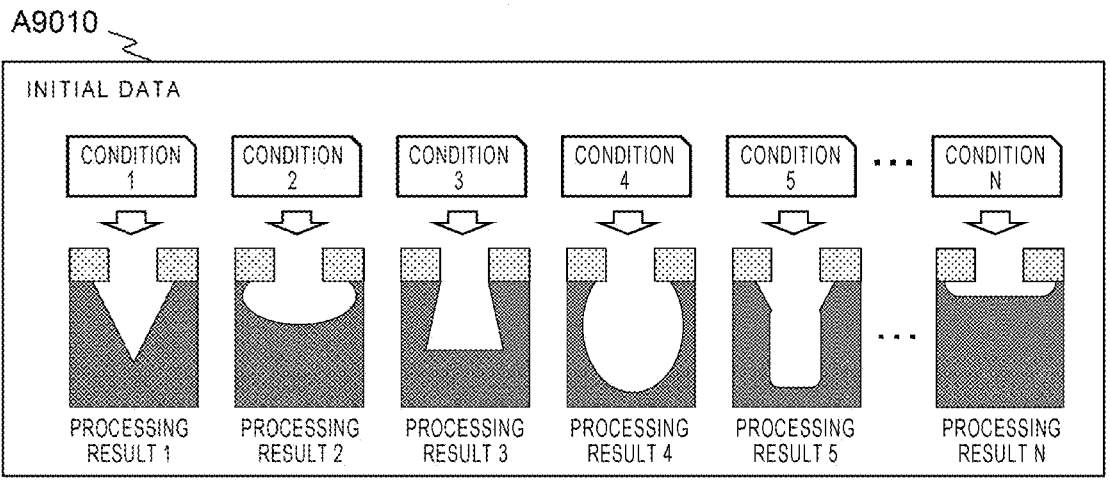
FIG. 15 illustrates Example 2 of the present invention, and is an explanatory diagram illustrating an example of initial data.

As the initial data used in step A901, a plurality of recipes illustrated in FIG. 15 and processed shape data of when etching is performed by using each of the recipes ma be input. By using initial data including various etching shapes, it is possible to predict a region in which a recipe parameter for realizing a target shape is present in a recipe parameter space with high efficiency in prediction of a solution using a prediction model.

Initial data A9010 includes, as illustrated in FIG. 15, a tapered shape (condition 1), a round shape (conditions 2 and 4), a reverse tapered shape (condition 3), and an undercut shape (conditions 1, 2, 4, 5 and N), and, as other shapes, there are an etch-stop shape in which no etching proceeds at all, a bowing shape, a shape in which a mask is etched, and the like. For example, in a case where the initial data includes only a single shape, it is hard to predict a solution satisfying other shapes from a prediction model which is obtained on the basis of data thereof. Thus, among the shapes, at least two shapes, preferably, three or more shapes are included in the initial data.

FIG. 15 is a diagram illustrating an example of the initial data A9010. The initial data A9010 is formed of pairs of the conditions 1 to N and processing results 1 to N corresponding thereto, and the processing results 1 to N indicate examples of sectional shapes of processing objects.

Figure 16:
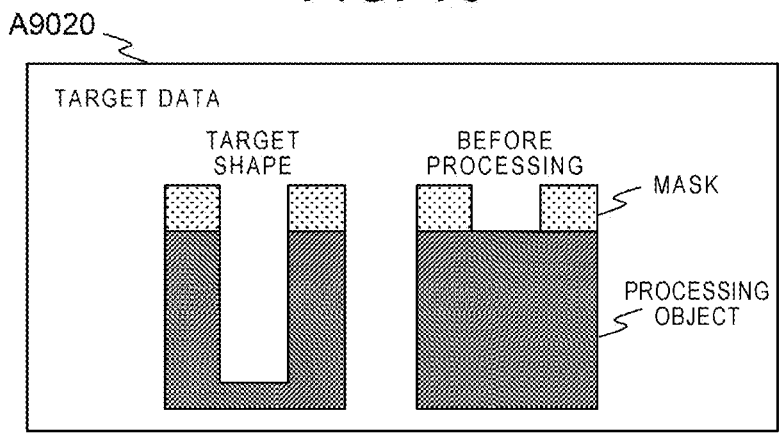
FIG. 16 illustrates Example 2 of the present invention, and is an explanatory diagram illustrating an example of target data.

As target data used in step A902, for example, a vertical processed shape as in target data A9020 illustrated in FIG. 16 is given. FIG. 16 is a diagram illustrating an example of the target data A9020. An example is illustrated in which the target data A9020 is formed of a sectional shape of a processing object before being processed, and a target sectional shape.

Figure 17:
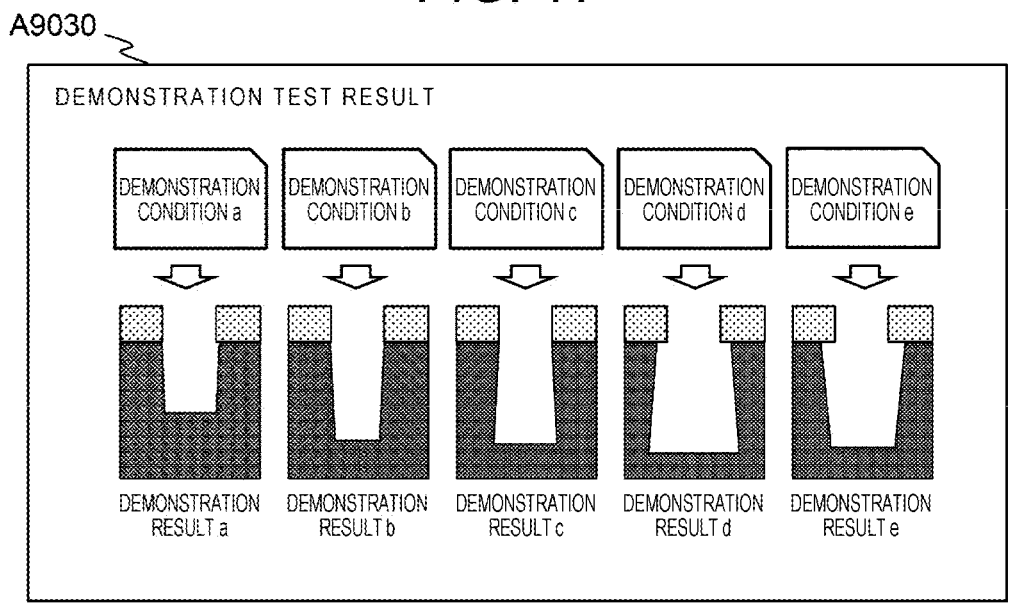
FIG. 17 illustrates Example 2 of the present invention, and is an explanatory diagram illustrating an example of a demonstration test result.

An example, of the demonstration test result in step A903 is as indicated by the demonstration test result A9030 illustrated in FIG. 17, and, in this case, an output (processed shape) closer to the target shape than a shape included in the initial data is obtained, and this corresponds to Yes in step A510. FIG. 17 is a diagram illustrating examples of the demonstration test result A9030. The demonstration test result A9030 is formed of pairs of demonstration conditions a to e and demonstration results a to e corresponding thereto, and the demonstration results a to e indicate examples of sectional shapes of a processing object.

Retrievals may be performed in parallel by using a plurality of etching apparatuses performing the same process, and thus a retrieval speed is improved. In this case, it is possible to increase a possibility that a solution satisfying a target can be retrieved by using a plurality of etching apparatuses in which an apparatus difference is corrected according to the procedures in FIG. 10 in the above Example 1. It is possible to retrieve a recipe causing an optimal processed shape to be obtained by developing the retrieved solution in the plurality of apparatuses.

Figure 18:
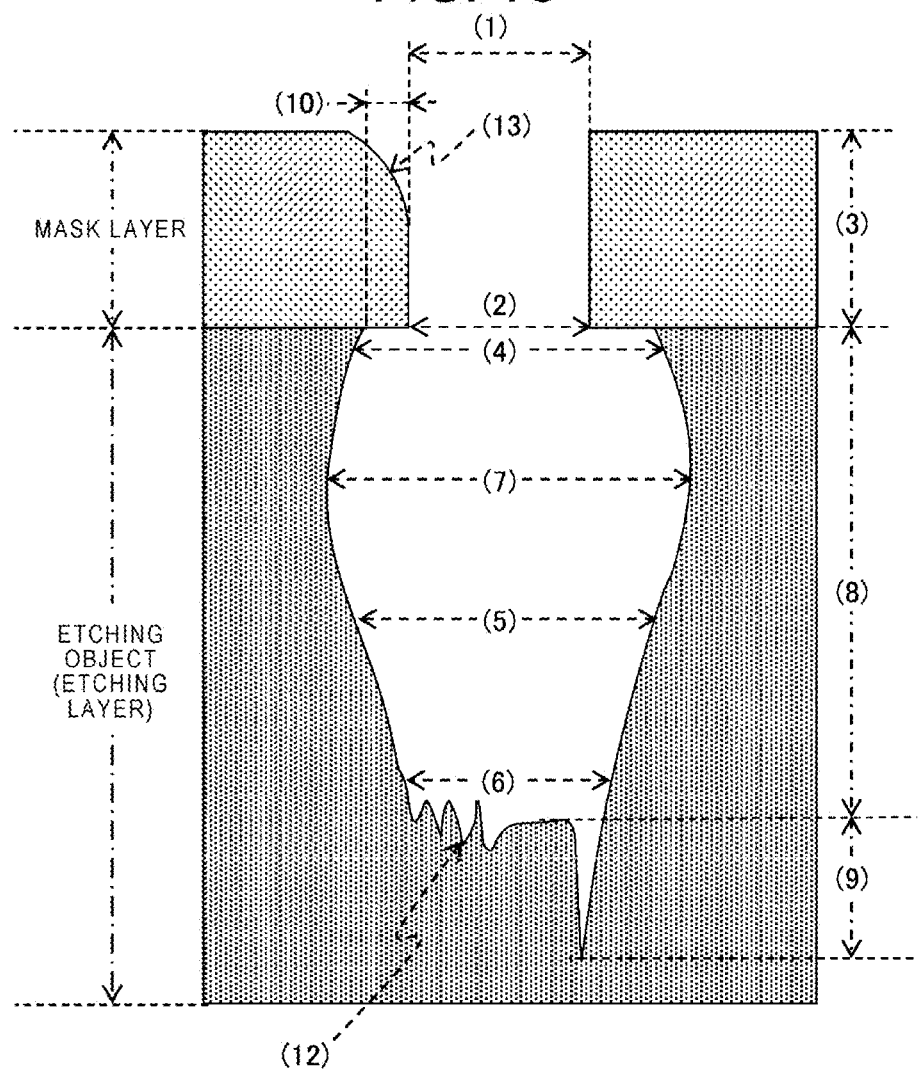
FIG. 18 illustrates Example 2 of the present invention, and is a sectional view illustrating an example of a processed shape.
Figure 19:
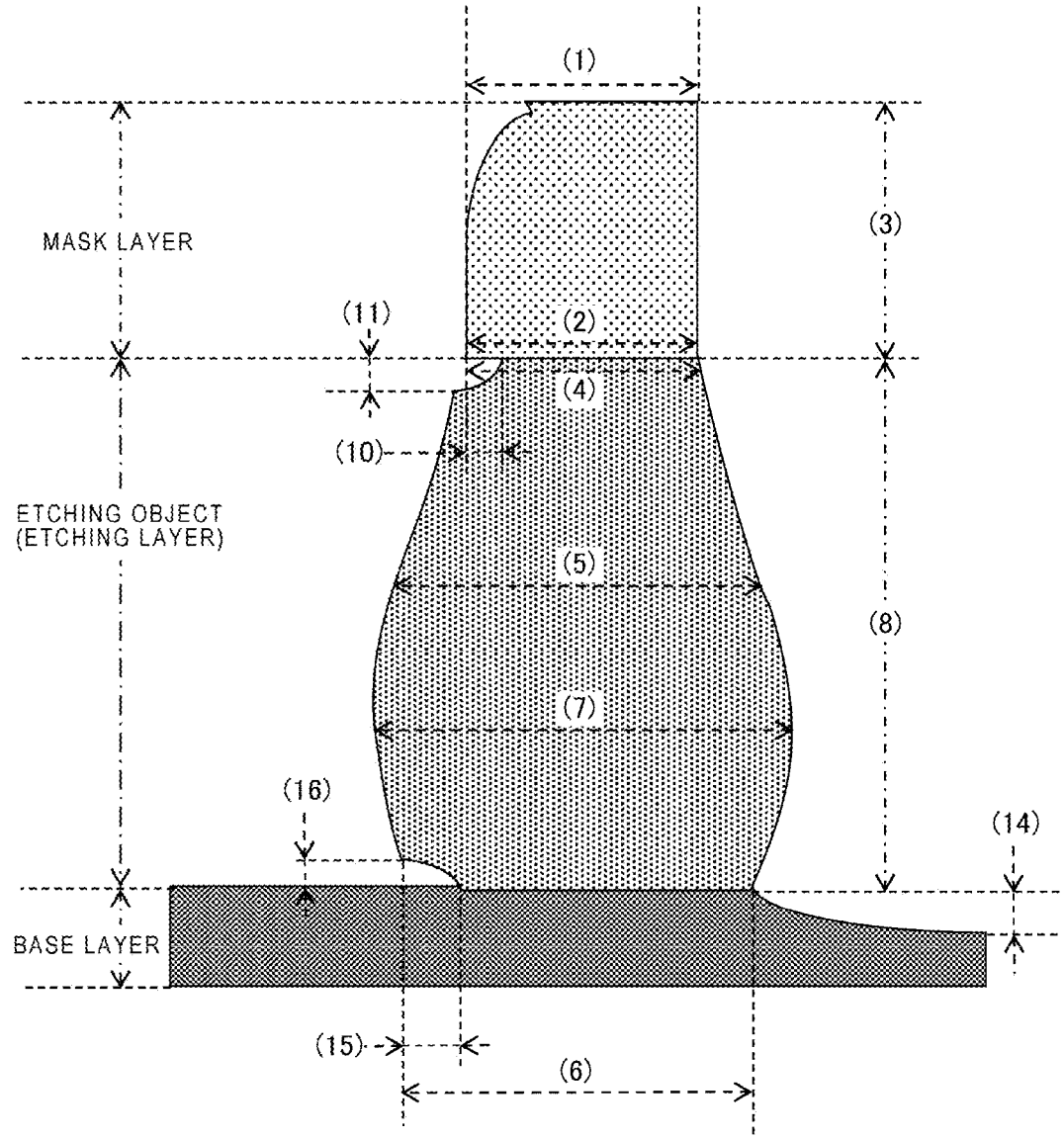
FIG. 19 illustrates Example 2 of the present invention, and is a sectional view illustrating an example of a processed shape.

FIGS. 18 and 19 illustrate examples in which a processed, sectional shape is acquired by using an electron microscope, in which FIG. 18 illustrates a sectional shape obtained in groove or hole processing, and FIG. 19 illustrates a sectional shape obtained in line or pillar processing. An image of a section may be used as initial data. As illustrated in FIGS. 18 and 19, measured values such as (1) a mask top width, (2) a mask bottom width, (3) a mask thickness, (4) a processing part top width, (5) a width of a processing part center, (6) a width of a processing bottom, (7) a processing part maximum width, (8) a processing depth, (9) a micro groove width, (10) a undercut width, (11) an undercut depth, (12) a surface roughness, (13) a mask exhaustion, (14) a base omission depth, (15) a notch width, and (16) a notch height may be used as processed shape data. A more accurate value is preferably acquired as each value, but large/intermediate/small or A/B/C, or expression of discrete numerical values thereof such as 0/1/2 may be used as data.

As mentioned above, the retrieval apparatus 300 reference performs a retrieval method after maintenance of the semiconductor treatment apparatus 201, and thus it is possible to cause a value of an output parameter of the semiconductor treatment apparatus 201 to be close to a target value of an output parameter (apparatus output optimization function).

Figure 20:
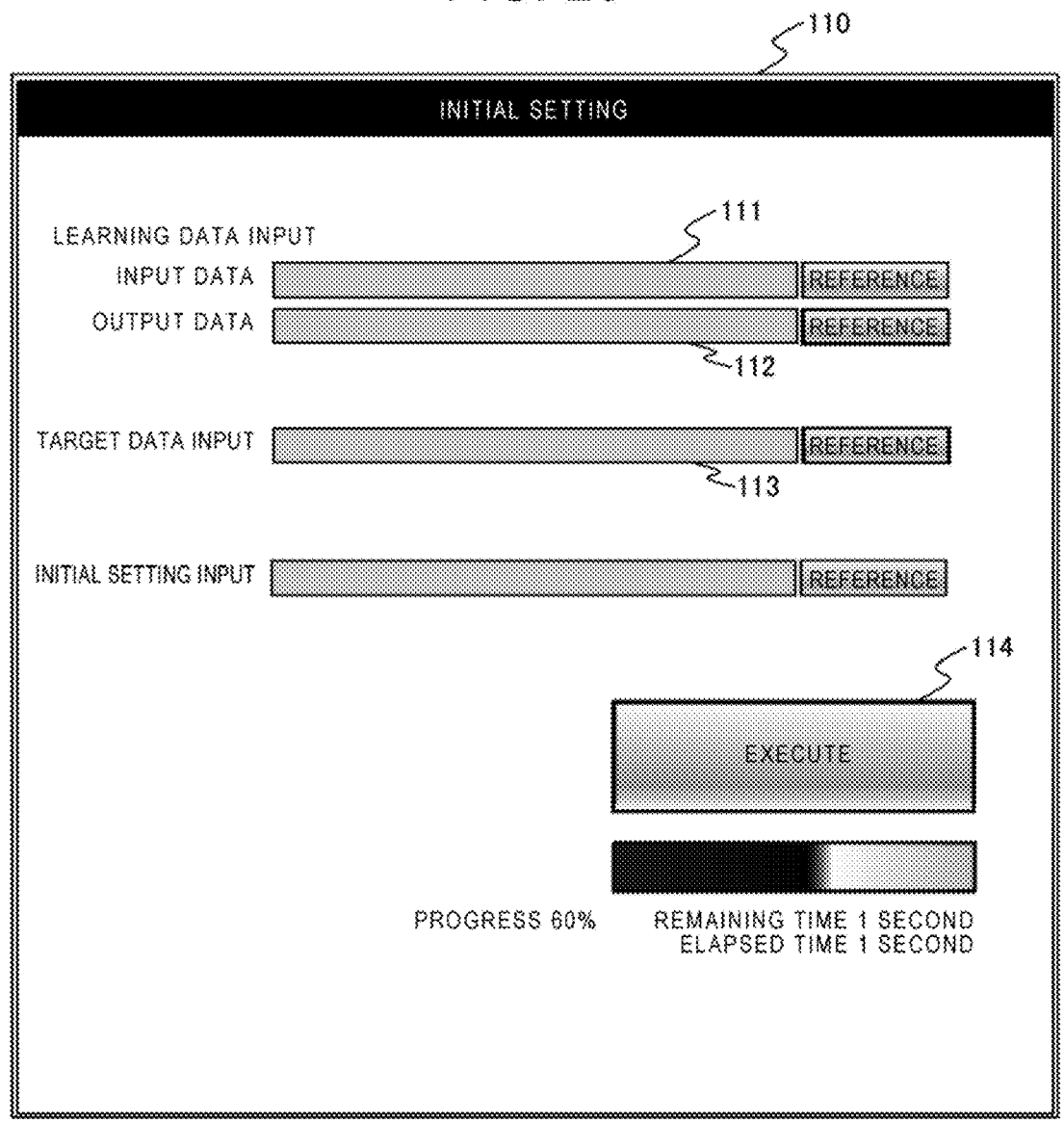
FIG. 20 illustrates Example 2 of the present invention, and is an explanatory diagram illustrating an initial setting screen.
Figure 21:
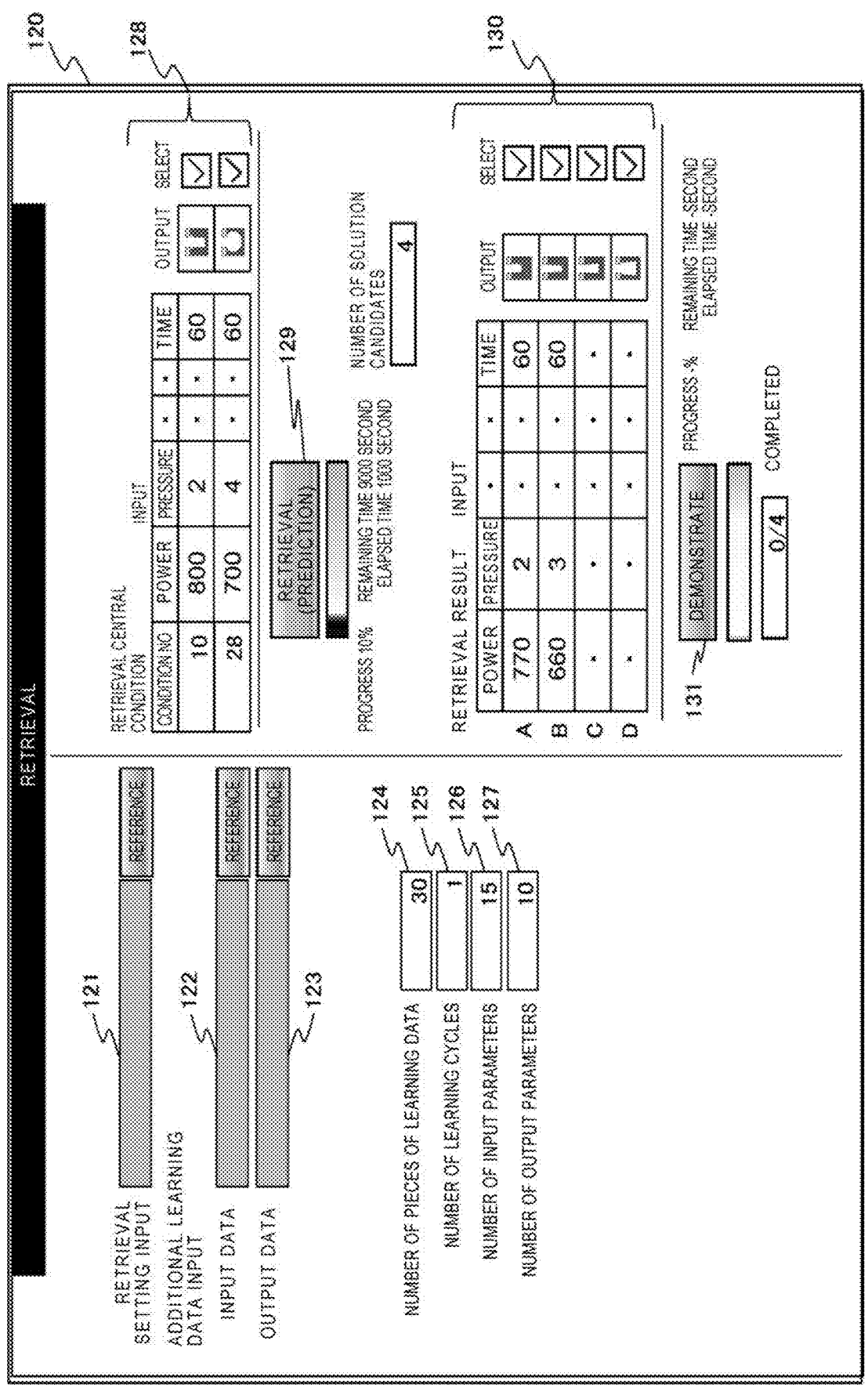
FIG. 21 illustrates Example 2 of the present invention, and is an explanatory diagram illustrating a retrieval screen.

FIGS. 20 and 21 illustrate examples of GUIs which are user interfaces of the retrieval apparatus 300.

FIG. 20 illustrates an initial setting screen 110 for designating initial data for an analysis object. In the initial setting screen 110, first, input data (apparatus input data) 111, output data 112, and target data (target value) 113 are input with file names. A file collecting input and output data may be designated as initial data for an analysis object, but, in this case, identifiers for identifying an input parameter and an output parameter are required to be described in the file.

After the data is designated, an execution button 114 is clicked, and thus each piece of data is read to be stored in the database 205. An indicator indicating the progress of file storing, a progress degree, the time until storing is completed, and elapsed time from starting of storing may be displayed on the initial setting screen 110.

After the execution button 114 in FIG. 20 is clicked, the screen transitions to a retrieval screen 120 in FIG. 21 for setting a retrieval condition and performing a retrieval. In the retrieval screen 120, first, retrieval setting 121 is input with a file name. Input data 122 and output data 123 acquired through a demonstration test may be input with file names.

The number 124 of pieces of learning data included in learning object data, the number 125 of learning cycles, the 126 of input parameters, and the number 127 of output parameters may be displayed on the retrieval screen 120. The number 125 of learning cycles is the number of acquiring learning data sets for prediction model generation, and increments by 1 whenever the input data 122 and the output data 123 acquired as a result of a demonstration test are added to the database 205 as additional learning data.

If the retrieval setting condition is designated, candidates of central conditions are displayed in a region 128, and any candidate may be selected from among the displayed central conditions as a central condition. If the central condition is selected, and a retrieval (prediction) button 129 is clicked, prediction is started, and a prediction result is displayed in a region 130 during the prediction or after completion of the prediction.

A progress degree of prediction, an elapsed time from starting of prediction, the remaining time for which prediction is continued, and the number of candidates of predictable solutions may be displayed on the retrieval screen 120. An estimated time until prediction is completed may be displayed.

One or both of an input and an output which are predicted as a prediction result may be displayed on the retrieval screen 120, and a demonstration test candidate may be selected. If the demonstration test is selected, and a demonstration test button 131 is clicked, a demonstration test is started. A progress degree of a demonstration test, an elapsed time from starting of a demonstration test, and the remaining time for which a demonstration test is continued may be displayed on the retrieval screen 120.

The number of selected demonstration tests, the number of completed demonstration tests and the number of remaining demonstration tests, and an estimated time until a demonstration test is completed may be displayed. After the demonstration test is completed, a demonstration test result is added to the above-described additional learning data, and prediction and demonstration tests are repeatedly performed, so that a learning cycle progresses, and a retrieval is continued.

An engineer may give an instruction for selection of a central condition candidate and a demonstration test candidate, and the starting of prediction and a demonstration test. Alternatively, a candidate may be automatically selected by designating a method of selecting a central condition candidate and a demonstration test candidate in advance when retrieval setting is input. In a case where output data can be automatically acquired by using a sensor or a monitor, prediction and a demonstration test can be automatically started.

Figure 22:
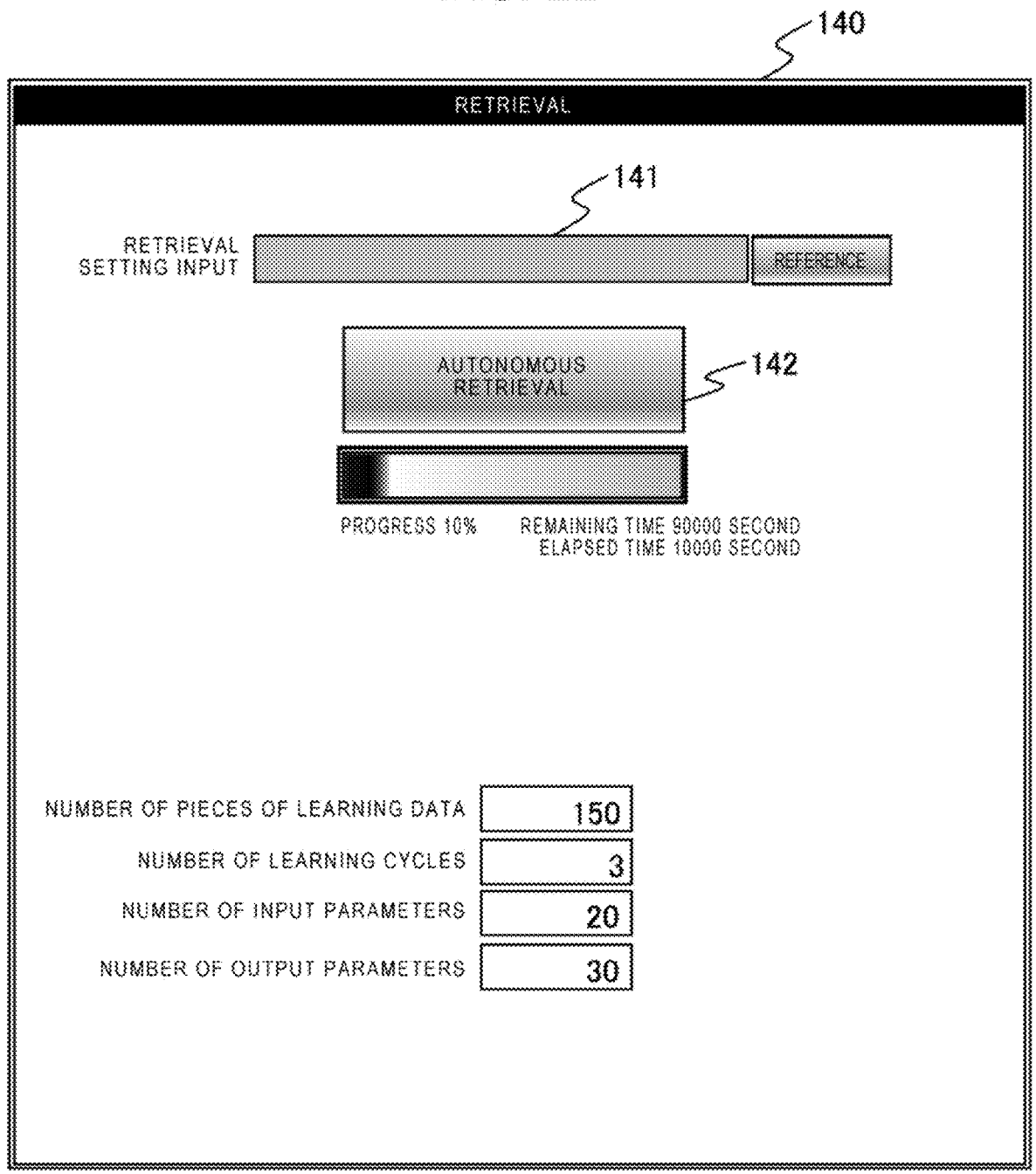
FIG. 22 illustrates Example 2 of the present invention, and is an explanatory diagram illustrating a retrieval screen for autonomous retrieval.

FIG. 22 is a retrieval screen 140 in a case where selection of a central condition candidate and a demonstration test candidate and the starting of prediction and a demonstration test are automatically started. A retrieval is automatically continued by perform retrieval setting input 141 and then clicking an autonomous retrieval button 142.

As mentioned above, the retrieval apparatus 300 automatically analyzes a value of an input parameter and a value of an output parameter of the semiconductor treatment apparatus 201, and automatically determines a test condition for retrieving the value of the input parameter by taking consideration an analysis result. The retrieval apparatus 300 automatically performs verification of a test result, and repeatedly performs the automatic operations, so as to be able to automatically retrieve value of an input parameter causing a target apparatus state and a target treatment result (a value of an output parameter) to be obtained. Consequently, the semiconductor treatment apparatus 201 can extract apparatus performance for itself, and can also support an engineer who performs control model development or selection of apparatus parameters (a combination of an input parameter and an output parameter) for extracting the apparatus performance.

As described above, the retrieval apparatus 300 according to the present example includes the input unit 401 which receives input of a target value indicating a condition set in the semiconductor treatment apparatus 201 treating a semiconductor or a processing result of the semiconductor treatment apparatus 201 treating a semiconductor, and at a reference value of the condition or the processing rest retrieval region defined in ranges of the condition and the processing result, indicated by the target value, the generation unit 402 which generates a relationship between the condition and the processing result on the basis of a set value of the condition in the retrieval region and an actually measured value of the processing result a case where the set value is given to the semiconductor treatment apparatus 201; the specifying unit 403 which gives the target value input via the input unit 401 to the prediction model generated by the generation unit 402 so as to acquire a predicted value front the prediction model, and specifies a presence region of the predicted value from the retrieval region; the first determination unit 404 which determines whether or not the predicted value is closer the target value than the reference value input via the input unit; the setting unit 405 which sets the predicted value as a reference value, and sets the presence region of the predicted value specified by the specifying unit as a retrieval region, in a case where the first determination unit 404 determines that the predicted value is closer to the target value; and the output unit 406 which outputs the predicted value satisfying an achievement condition in a case where the predicted value satisfies the achievement condition for the target value.

Consequently, it is possible to improve the accuracy of reaching the best solution regarding input and output for the semiconductor treatment apparatus 201. Therefore, it is possible to make an operation of the semiconductor treatment apparatus 201 efficient and to optimize treatment therein.

In the retrieval apparatus 300, in a case where the first determination unit 404 determines that a target value corresponding to the predicted value obtained from the prediction model is not close to the target value, the second determination unit 407 determines the predicted value and data acquired as output data corresponding to the predicted value as exclusion data, and the setting unit 405 sets a residual region obtained by excluding the exclusion data and an exclusion region in a case where the exclusion data is obtained, as a retrieval region. Consequently, it is possible to exclude an exclusion region in which a combination of a predicted value not dose to a target value and the target value is present from the latest retrieval region, and thus to improve the accuracy of reaching the best solution.

In the retrieval apparatus 300, the division unit 408 divides the retrieval region into a plurality of regions, and, in a case where the first determination unit 404 determines that the predicted value is closer to the target value, the specifying unit 403 sets the predicted value as a reference value, and specifies a presence region of the predicted value among a plurality of division regions. Consequently, it is possible to easily specify a presence region of a predicted value, and thus to improve a retrieval speed.

In the retrieval apparatus 300, the division unit $08 divides the retrieval region into a plurality of regions, and the generation unit 402 acquires an actually measured value of a processing result in a case where a set value of a condition in a division region is given to the semiconductor treatment apparatus 201 for each division region. The generation unit 402 generates a prediction, model on the basis of the set value of the condition in each division region and the actually measured value of the processing result. Consequently, it is possible to acquire actually measured values for the respective division regions in parallel by using a plurality of the semiconductor treatment apparatuses 201, and thus to increase a speed of generating a prediction model.

In the retrieval apparatus 300, in a case where the first determination unit 404 determines that a target value corresponding to the predicted value is not close to the target value, the second determination unit 407 determines the predicted value and data acquired as output data corresponding to the predicted value as exclusion data, and the generation unit 402 generates a prediction model an the basis of a specific actually measured value obtained by excluding the exclusion data from the actually measured value, and a specific set value obtained by excluding a set value given to the semiconductor treatment apparatus 201 in a case where the exclusion data is obtained from the set value. It is possible to exclude an exclusion region in which a predicted value not close to a target value and a set value from a candidate of a predicted value, and thus to improve the accuracy of a prediction model. Therefore, it is possible to obtain a better predicted value on the basis of a generated prediction model.

In the retrieval apparatus 300, the detection unit 409 determines an unstable operation of the semiconductor treatment apparatus 201 on the basis of an actually measured value of a processing result and a predetermined output threshold value, and the output unit 406 outputs a detection result in the detection unit 409. Consequently, it is possible to prompt a user to check whether or not a retrieval is continued.

The present invention is not limited to the above Examples, and includes a plurality of modification examples and equivalent configurations within the scope of the accompanying claims. The above Examples have been described in detail for better understanding of the present invention, and thus are not necessarily limited to including all, of the above-described configurations. Some configurations of a certain Example may be replaced with some configurations of another Example. Configurations of another Example may be added to configurations of a certain Example. The configurations of other Examples, may be added to, deleted from, and replaced with some of the configurations of each Example.

Some or all of the above-described respective configurations, functions, processing units, processing means, and the like may be designed as, for example, integrated circuits so as to be realized in hardware, and may be realized in software by a processor interpreting and executing a program for realizing each function.

Information regarding a program, a table, a file, and the like for realizing each function may be stored in a storage device such as a memory, a hard disk, or a solid state drive (SSD), or a recording medium such as an integrated circuit (IC) card, an SD card, and a digital versatile disc (DVD).

A control line or an information line which is necessary for description is illustrated, and all control lines or information lines on a product may not necessarily be illustrated. It may be considered that almost all of the configurations are actually connected to each other.

APPENDIX

There are the representative following viewpoints of the present invention other than the viewpoints recited in the claims.

<16>

The retrieval method according to claim 12, wherein, in the second step, the retrieval region is divided into a plurality of regions, the actually measured value in a case where a set value of the condition in each of the plurality of division regions is given to the semiconductor treatment apparatus is acquired for each division region, and the prediction model is generated on the, basis of the set value of the condition in each division region and the actually measured value.

<17>

The retrieval method according to claim 12, wherein, in the fifth step, in a case where it is determined that the actually measured value corresponding to the predicted value is not dose to the target value, the predicted value is determined as exclusion data, and the prediction model is generated on the basis of a specific actually measured value obtained by excluding the exclusion data from the actually measured value, and a specific set value obtained by excluding, from the set value, a set value given to the semiconductor treatment apparatus in a case where the exclusion data is obtained.

<18>

The retrieval method according to claim 12, further comprising:
a sixth step of causing the retrieval apparatus to detect an unstable operation of the semiconductor treatment apparatus on the basis of the actually measured value and a predetermined output threshold value, and to output a detection result.

<19>

The retrieval method according to claim 12, wherein, in the third step, a plurality of predicted values are acquired in one prediction using the prediction model.

<20>

The retrieval method according to claim 12, wherein, in the second step, a retrieval is performed in the retrieval region after initial generation of the prediction model, and the prediction model is updated by using a retrieval result.

<71>

The retrieval method according to claim 12, wherein, in the third step, prediction is performed by using a plurality of prediction models, and a predicted value is acquired from each of the prediction models.

<22>

The retrieval method according to claim 12, wherein, in the first step, a screen for inputting the processing result, the condition, and the target value is generated, and the processing result, the condition, and the target value are received via the screen.

What is claimed is:

1. A retrieval apparatus which retrieves a condition given to a semiconductor treatment apparatus, the retrieval apparatus comprising:
a processor; and
a memory,
wherein the processor
receives a processing result of a semiconductor being treated by the semiconductor treatment apparatus, a condition corresponding to the processing result, a target value for treating the semiconductor in the semiconductor treatment apparatus, and a retrieval region defined by ranges of the condition and the processing result,
generates a prediction model indicating a relationship between the condition and the processing result on a basis of a set value of the condition in the retrieval region, and the processing result in a case where the set value is given to the semiconductor treatment apparatus,
calculates a plurality of predicted values from the prediction model by giving at least an upper limit of the target value and a lower limit of the target value to the prediction model,
transmits the plurality of predicted values to the semiconductor treatment apparatus to perform a demonstration test, and acquires a result of the demonstration test as an actually measured value, and
determines whether or not the actually measured value reaches the target value, outputs the plurality of predicted values as a plurality of set values of the condition in a case where the actually measured value reaches the target value, and applies the plurality of predicted values and the actually measured value to the plurality of set values of the condition and the processing result, respectively, so as to update the prediction model in a case where the actually measured value does not reach the target value.

2. The retrieval apparatus according to claim 1, wherein the processor determines whether or not the actually measured value reaches the target value, and, in a case where the actually measured value reaches the target value, the processor updates the target value toward a final target value stepwise, and repeatedly updates the prediction model until the final target value is reached.

3. The retrieval apparatus according to claim 1, wherein, in a case where it is determined that the actually measured value corresponding to the plurality of predicted values is not close to the target value, the processor determines a predicted value in a presence region of the plurality of predicted values and the actually measured value as exclusion data, and
wherein the processor sets, as the retrieval region, a residual region obtained by excluding the determined exclusion data and an exclusion region set in a case where the exclusion data is obtained, from the retrieval region.

4. The retrieval apparatus according to claim 1, wherein the processor divides the retrieval region into a plurality of regions, and, in a case where it is determined that the actually measured value corresponding to the plurality of predicted values is close to the target value, the processor sets the plurality of predicted values as reference values, and specifies a presence region of the plurality of predicted values among the plurality of division regions.

5. The retrieval apparatus according to claim 1, wherein the processor divides the retrieval region into a plurality of regions, acquires the actually measured value in a case where a set value of the condition in each of the plurality of division regions is given to the semiconductor treatment apparatus, for each division region, and generates the prediction model on the basis of the set value of the condition in each division region and the actually measured value.

6. The retrieval apparatus according to claim 1, wherein, in a case where it is determined that the actually measured value corresponding to the plurality of predicted values is not close to the target value, the processor determines the plurality of predicted values as exclusion data, and generates the prediction model on the basis of a specific actually measured value obtained by excluding the exclusion data from the actually measured value, and a specific set value obtained by excluding, from the set value, a set value given to the semiconductor treatment apparatus in a case where the exclusion data is obtained.

7. The retrieval apparatus according to claim 1, wherein the processor detects an unstable operation of the semiconductor treatment apparatus on the basis of the actually measured value and a predetermined output threshold value, and outputs a detection result.

8. The retrieval apparatus according to claim 1, wherein the processor acquires the plurality of predicted values in one prediction using the prediction model.

9. The retrieval apparatus according to claim 1, wherein the processor performs a retrieval in the retrieval region after initial generation of the prediction model, and updates the prediction model by using a retrieval result.

10. The retrieval apparatus according to claim 1, wherein the processor performs prediction by using a plurality of prediction models, and acquires a predicted value from each of the prediction models.

11. The retrieval apparatus according to claim 1, wherein the processor generates a screen for inputting the processing result, the condition, and the target value, and receives the processing result, the condition, and the target value via the screen.

12. A retrieval method in which a retrieval apparatus including a processor and a memory retrieves a condition given to a semiconductor treatment apparatus, the retrieval method comprising:
causing the retrieval apparatus to execute
a first step of receiving a processing result of a semiconductor being treated by the semiconductor treatment apparatus, a condition corresponding to the processing result, a target value for treating the semiconductor in the semiconductor treatment apparatus, and a retrieval region defined by ranges of the condition and the processing result,
a second step of generating a prediction model indicating the condition and the processing result on a basis of a set value of the condition in the retrieval region, and the processing result in a case where the set value is given to the semiconductor treatment apparatus,
a third step of calculating a plurality of predicted values from the prediction model by giving at least an upper limit of the target value and a lower limit of the target value to the prediction model,
a fourth step of transmitting the plurality of predicted values to the semiconductor treatment apparatus to perform a demonstration test, and acquires a result of the demonstration test as an actually measured value, and
a fifth step of determining whether or not the actually measured value reaches the target value, outputs the plurality of predicted values as set values of the condition in a case where the actually measured value reaches the target value, and applies the plurality of predicted values and the actually measured value to the set value of the condition and the processing result, respectively, so as to update the prediction model in a case where the actually measured value does not reach the target value.

13. The retrieval method according to claim 12, wherein, in the fifth step, it is determined whether or not the actually measured value reaches the target value, and, in a case where the actually measured value reaches the target value, the target value is updated toward a final target value stepwise, and the prediction model is repeatedly updated until the final target value is reached.

14. The retrieval method according to claim 12, wherein, in the fifth step, in a case where it is determined that the actually measured value corresponding to the plurality of predicted values is not close to the target value, a predicted value in a presence region of the plurality of predicted values and the actually measured value are determined as exclusion data, and a residual region obtained by excluding the determined exclusion data and an exclusion region set in a case where the exclusion data is obtained, from the retrieval region, is set as the retrieval region.

15. The retrieval method according to claim 12, wherein, in the fifth step, the retrieval region is divided into a plurality of regions, and, in a case where it is determined that the actually measured value corresponding to the plurality of predicted values is close to the target value, the plurality of predicted values are set as reference values, and a presence region of the plurality of predicted values is specified among the plurality of division regions.

* * * * *